United States Patent
Park

(10) Patent No.: US 7,126,854 B2
(45) Date of Patent: Oct. 24, 2006

(54) TECHNIQUE FOR PROGRAMMING FLOATING-GATE TRANSISTOR USED IN CIRCUITRY AS FLASH EPROM

(75) Inventor: Jongmin Park, Fremont, CA (US)

(73) Assignee: Promos Technologies Inc., Hsinchu (TW)

( * ) Notice: Subject to any disclaimer, the term of this patent is extended or adjusted under 35 U.S.C. 154(b) by 115 days.

(21) Appl. No.: 10/780,031

(22) Filed: Feb. 17, 2004

(65) Prior Publication Data

US 2005/0180214 A1   Aug. 18, 2005

(51) Int. Cl.
    *G11C 16/04* (2006.01)
(52) U.S. Cl. .......................... 365/185.18; 365/185.26; 365/185.28
(58) Field of Classification Search ........... 365/185.18, 365/177, 185.26, 185.19, 185.28
   See application file for complete search history.

(56) References Cited

U.S. PATENT DOCUMENTS

| | | | | |
|---|---|---|---|---|
| 4,888,734 A | | 12/1989 | Lee et al. ................... | 365/185 |
| 5,077,691 A | * | 12/1991 | Haddad et al. ........ | 365/185.23 |
| 5,818,761 A | | 10/1998 | Onakado et al. ....... | 365/185.22 |
| 5,943,261 A | * | 8/1999 | Lee ........................ | 365/185.14 |
| 5,978,267 A | * | 11/1999 | Chen et al. ............ | 365/185.17 |
| 6,040,216 A | | 3/2000 | Sung ......................... | 438/257 |
| 6,194,269 B1 | | 2/2001 | Sung et al. ................ | 438/258 |
| 6,355,524 B1 | * | 3/2002 | Tuan et al. ................ | 438/257 |
| 6,584,018 B1 | | 6/2003 | Tuan et al. ............ | 365/128.28 |

OTHER PUBLICATIONS

U.S. Appl. No. 10/640,929, filed Aug. 2003, inventor Kim.
U.S. Appl. No. 10/780,030, filed Feb. 2004, inventor Park.
Nation el al., "Architectural Impacts on Flash Endurance and Flash Data Retention", AMD Flash Technology White Paper, Rev. 37, Advanced Micro Drives, Nov. 7, 1999, pp. 1 - 17.

* cited by examiner

Primary Examiner—Richard Elms
Assistant Examiner—Eric J. Wendler
(74) Attorney, Agent, or Firm—Ronald J. Meetin

(57) ABSTRACT

The sequence in which the voltages ($V_{SL}$, $V_{DL}$, $V_{SG}$, and $V_{CL}$) applied to the source/drain regions (S and D), select gate (SG), and (if present) control gate (CG) of a floating-gate field-effect transistor (20) start to change value during a programming operation is controlled so as to avoid adjusting the transistor's programmable threshold voltage toward a programmed value when the transistor is intended to remain in the erased condition, i.e., not go into the programmed condition. With the voltage ($V_{SL}$) at one source/drain region (S) changing from a nominal value to a programming value, the sequence entails causing the voltage (SG) at the select gate to start changing from a nominal value to a programming-enable value after the voltage at the other source/drain region (D) starts changing from a nominal value to a programming-inhibit value.

50 Claims, 9 Drawing Sheets

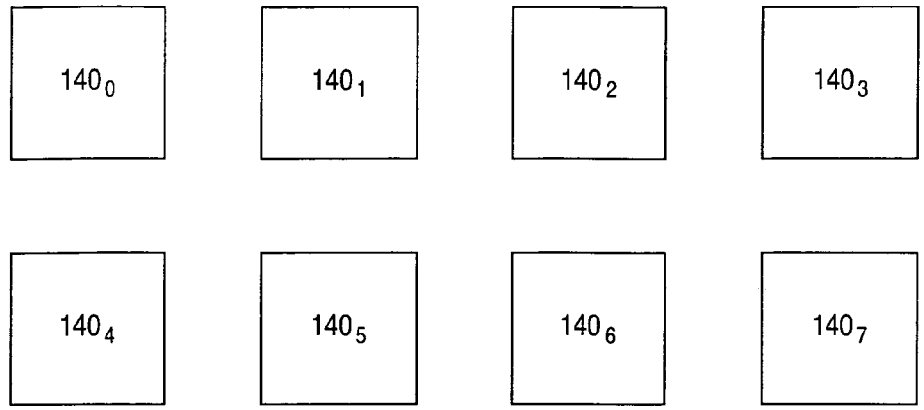
Fig. 16
Fig. 17
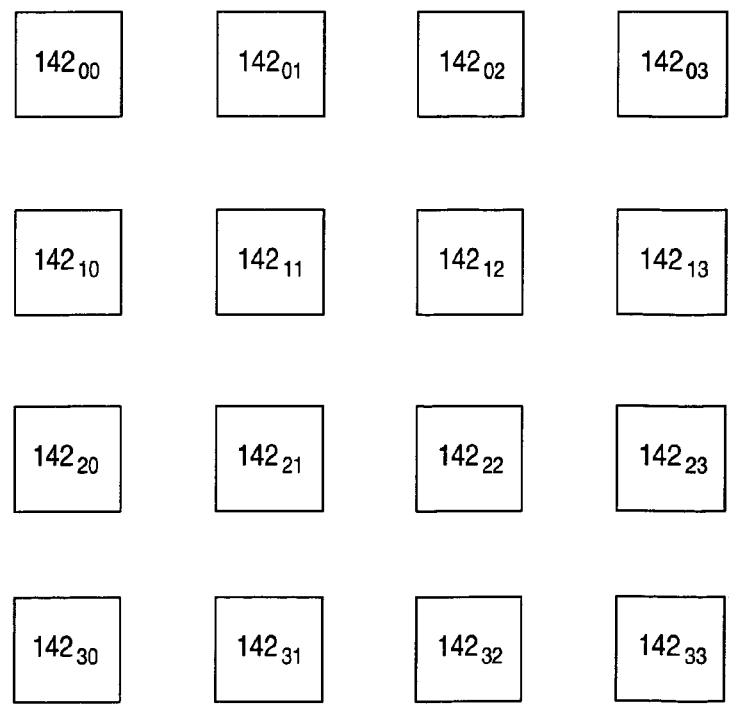

TECHNIQUE FOR PROGRAMMING FLOATING-GATE TRANSISTOR USED IN CIRCUITRY AS FLASH EPROM

FIELD OF USE

This invention relates to floating-gate field-effect transistors ("FETs") utilized in electronic circuitry such as erasable programmable read-only memories ("EPROMs") of the flash-erasable type.

BACKGROUND ART

A floating-gate FET is a basic semiconductor device in which a floating-gate electrode (often simply "floating gate") overlies a channel region that extends between a pair of source/drain regions. A control-gate electrode (often simply "control gate") overlies the floating gate. In some floating-gate FETs such as that described in U.S. Pat. No. 6,355,524 B1, a further electrode commonly referred to as the select-gate electrode (often simply "select gate") is situated to the side of the floating and control gates above the channel region. This type of floating-gate FET is referred to here as a triple-gate split-gate device because it has three gate electrodes with the select gate split laterally apart from the floating gate.

A floating-gate FET has a threshold voltage, referred to here as the programmable threshold voltage, which can be adjusted subsequent to FET fabrication to control the FET's operational characteristics. During FET operation, one of the source/drain region functions as the source while the other functions as the drain. A control voltage is applied between the control gate and the source. With suitable potentials applied to other parts of the FET, including the select gate when the FET is a triple-gate split-gate device, the programmable threshold voltage is the value of the control voltage at which the FET switches between on and off conditions.

Floating-gate FETs are commonly employed as memory elements in EPROMs such as flash EPROMs. The storage of data in a floating-gate memory FET is controlled by variously placing charge carriers on, and removing charge carriers from, the floating gate to adjust the programmable threshold voltage. These two actions are generally referred to as "programming" and "erasure". In a flash EPROM, all of the memory elements in a substantial portion of the EPROM are erased simultaneously.

Programming in a segment of a flash EPROM is performed after all the memory elements in that segment have been erased. In a flash EPROM whose memory elements consist of n-channel triple-gate floating-gate FETs, selected ones of the memory FETs in a selected row of the FETs are programmed by placing the sources and control gates of the selected FETs at suitable high programming voltages, holding their drains and channel regions at suitable low voltages, and applying suitable intermediate programming-enable voltages to their select gates. Electrons then travel from the drain of each selected FET to its source. Some of these electrons are drawn into the floating gate of each selected FET to raise its threshold voltage and place the FET in the programmed condition.

The drain of each remaining FET, i.e., each unselected FET, in the selected cell row is raised to a sufficiently high voltage that electrons do not travel from the drain of that FET to its source. This enables each unselected FET to remain in its prior condition, either erased or programmed if that FET was programmed in an earlier operation. Programming needs to be done carefully to avoid programming errors and unnecessary power consumption.

GENERAL DISCLOSURE OF THE INVENTION

The present invention furnishes a technique for programming a floating-gate FET that typically serves as a memory element in an electronic circuit such as a flash EPROM. The FET has a pair of source/drain regions, referred to as the first and second source/drain regions, separated by a channel portion of a body region that forms a pn junction with each source/drain region. A floating-gate electrode adjacent to the first source/drain region overlies a first part of the channel portion. A select-gate electrode adjacent to the second source/drain region overlies a second part of the channel portion lateral to, i.e., to the side of, the first part of the channel portion. Although the select gate can extend over the floating gate, the FET preferably has a separate control-gate electrode that overlies the floating gate above the first part of the channel portion.

The floating-gate FET is typically of n-channel type but can be of p-channel type. Initially the FET is in an erased condition with its programmable threshold voltage (a) less than a first transition value $V_{T1}$ if the FET is of n-channel type or (b) greater than $-V_{T1}$ if the FET is of p-channel type. The FET is selectively placed in a programmed condition with its programmable threshold voltage (a) greater than a second transition value $V_{T2}$ if the FET is of n-channel type or (b) less than $-V_{T2}$ if the FET is of p-channel type where $V_{T2}$ exceeds or equals $V_{T1}$.

The programming technique of the invention entails controlling the voltages applied to the source/drain regions, the select gate, and (when present) the control gate so as to avoid having the programmable threshold voltage be adjusted toward the programmed value when the FET is not, in fact, intended to go into the programmed condition. For instance, when the FET is an unselected one of a selected group of FETs that, as a group, are subjected to a programming operation, adjusting the voltages applied to the source/drain regions, the select gate, and the control gate according to the invention prevents an unselected one of the FETs in the selected group from being placed in, or moved significantly toward, its programmed condition at the same time that each selected FET is placed in its programmed condition. The invention thereby avoids programming errors. The programming technique of the invention also avoids unnecessary power consumption.

More particularly, a first voltage applied to the first source/drain region is changed from a nominal first value to a programming first value. A second voltage applied to the second source/drain region is controlled to selectively achieve one of two values depending on whether the FET is intended to go into the programmed condition or remain in the erased condition. If the FET is to remain in the erased condition, the second voltage goes from a nominal second value to a programming-inhibit second value. The second voltage remains largely at its nominal value if the FET is to go into the programmed condition. A select (or select-gate) voltage applied to the select gate is changed from a nominal select value to a programming-enable select value. If the control gate is present, a control (or control-gate) voltage applied to the control gate is changed from a nominal control value to a programming control value.

The timing of the voltages applied to the FET is controlled according to the invention so that, in an instance where the FET is to remain in the erased condition, the select voltage starts changing from its nominal value to the programming-enable value after the second voltage starts changing from its nominal value to the programming-inhibit value. The select voltage also preferably starts changing from its nominal value to the programming-enable value after the first voltage starts changing from its nominal value to its programming value and, if the control gate is present, after the control voltage starts changing from its nominal value to its programming value. Controlling the voltages applied to the FET in this way strongly ensures that the FET remains in the erased condition without moving significantly toward the programmed condition.

To see why the programming technique of the invention is advantageous, consider what would happen if the FET were intended to remain in the erased condition in the situation where the select voltage starts changing from its nominal value to the programming-enable value at approximately the same time that the first, second, and control voltages start changing from their nominal values to their various programming and programming-inhibit values. Under these circumstances, the first, select, and control voltages might sometimes change sufficiently faster than the second voltage that the FET temporarily turns on. Charge carriers would temporarily flow from the second source/drain region to the first source/drain region.

If the difference between the control and second voltages became sufficiently great during part or all of the time that the FET is temporarily on with the control voltage moving towards its programming value, some of these charge carriers might be drawn to the floating gate. The programmable threshold voltage would then be adjusted toward a programmed value even though the FET is intended to remain in the erased condition. The resulting program disturbance could cause an error in later reading the FET. Unnecessary power would also be consumed by the charge-carrier flow.

In the preceding comparative circumstances where the select voltage starts changing at approximately the same time that the first, second, and control voltages start changing, the select and second voltages might sometimes change sufficiently faster than the first voltage that the FET turns on in the opposite direction from that indicated earlier. The resultant charge-carrier flow from the first source/drain region to the second source/drain region would again unnecessarily consume power. The present invention avoids these program-disturbance and power-consumption difficulties by suitably delaying the point at which the select voltage changes from its nominal value to the programming-enable value so that the FET does not temporarily turn on when it is intended to remain in the erased condition.

The first, second, select, and control voltages usually return to their nominal values to complete the programming operation. These voltage-return activities are preferably done in a manner generally complementary to that by which the first, second, select, and control voltages earlier changed to their various programming, programming-inhibit, and programming-enable values so as to again achieve the previously mentioned advantages.

Suitable control circuitry provides the first, second, select, and control voltages in the preceding manner. The FET is typically one of a group of memory elements in an EPROM that contains the control circuitry. In short, the invention provides a significant advance over the prior art.

BRIEF DESCRIPTION OF THE DRAWINGS

FIG. 16 is a block diagram of a group of mats in an embodiment of the EPROM of FIGS. 1 and 2.

FIG. 17 is block diagram of a group of EPROM sectors in the mat of FIG. 16.

Figure 1:
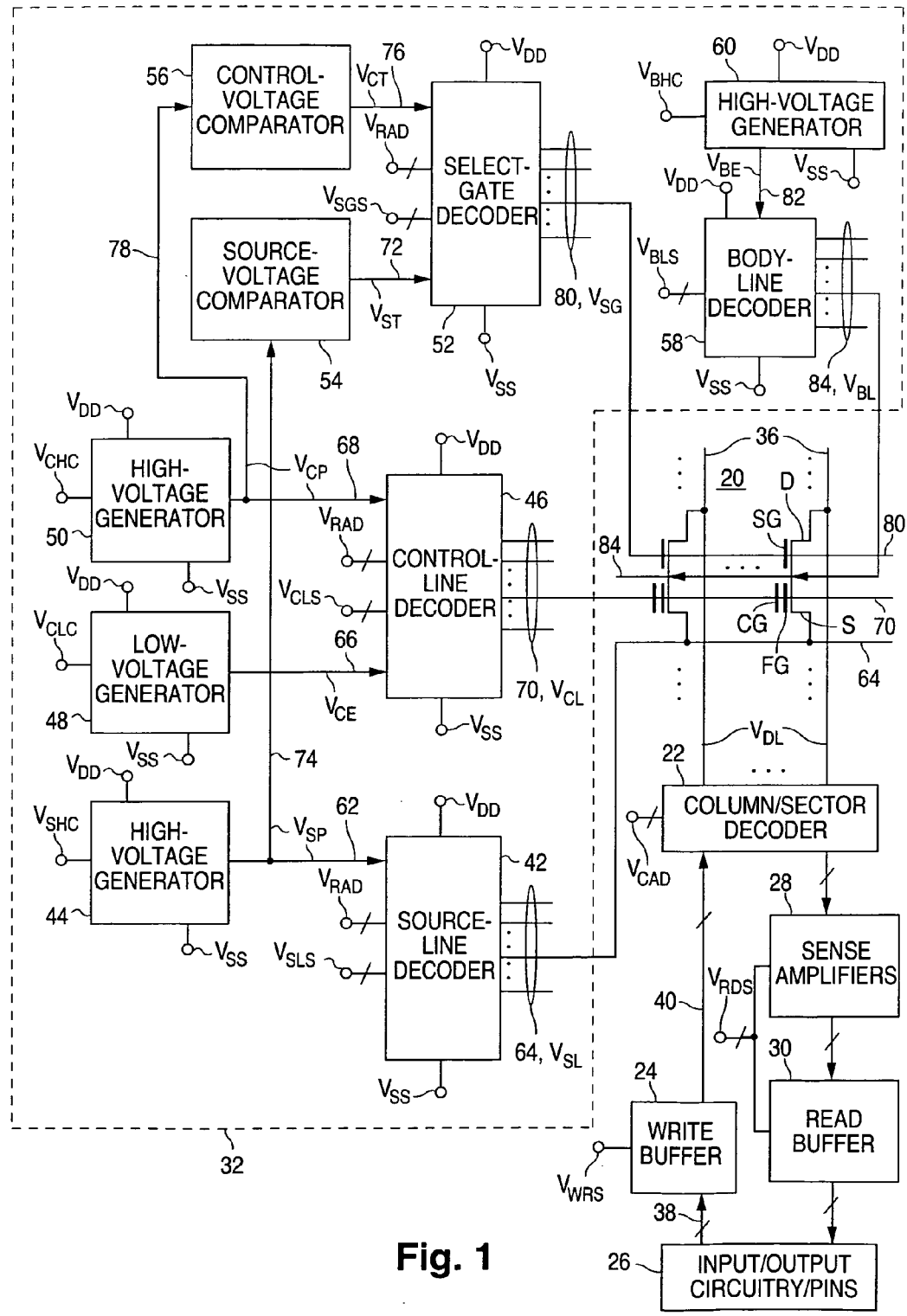
FIG. 1 is a block/circuit diagram of part of a flash EPROM configured according to the invention.

Like reference symbols are employed in the drawings and in the description of the preferred embodiments to represent the same, or very similar, item or items. Each line provided with a slash in the drawings represents multiple electrical lines or conductors. Some of the electrical conductors shown in the drawings are provided with arrowheads to indicate the directions in which signals travel on those conductors.

DESCRIPTION OF THE PREFERRED EMBODIMENTS

In the following description, the term "connected" generally means physically connected except where indicated to mean electrically connected in order to permit passage of an electrical signal. The term "line" means an electrical line or conductor.

A flash EPROM typically contains a plurality of sections, referred to here as sectors, each containing an array of memory cells which are erased simultaneously and which can be erased separately, and thus at different times, than the memory cells in each other such EPROM sector. As used in describing a line that carries a signal for such a simultaneously erasable EPROM sector, the term "local" means that the signal is local to that EPROM sector and is not provided to any other simultaneously erasable EPROM sector. The term "global" as used in describing a line that carries a signal for a simultaneously erasable EPROM sector means that the line provides the signal to at least one other such sector. A "global" line can be global to the entire EPROM or to a group, often called a mat, of the EPROM sectors.

Figure 2A:
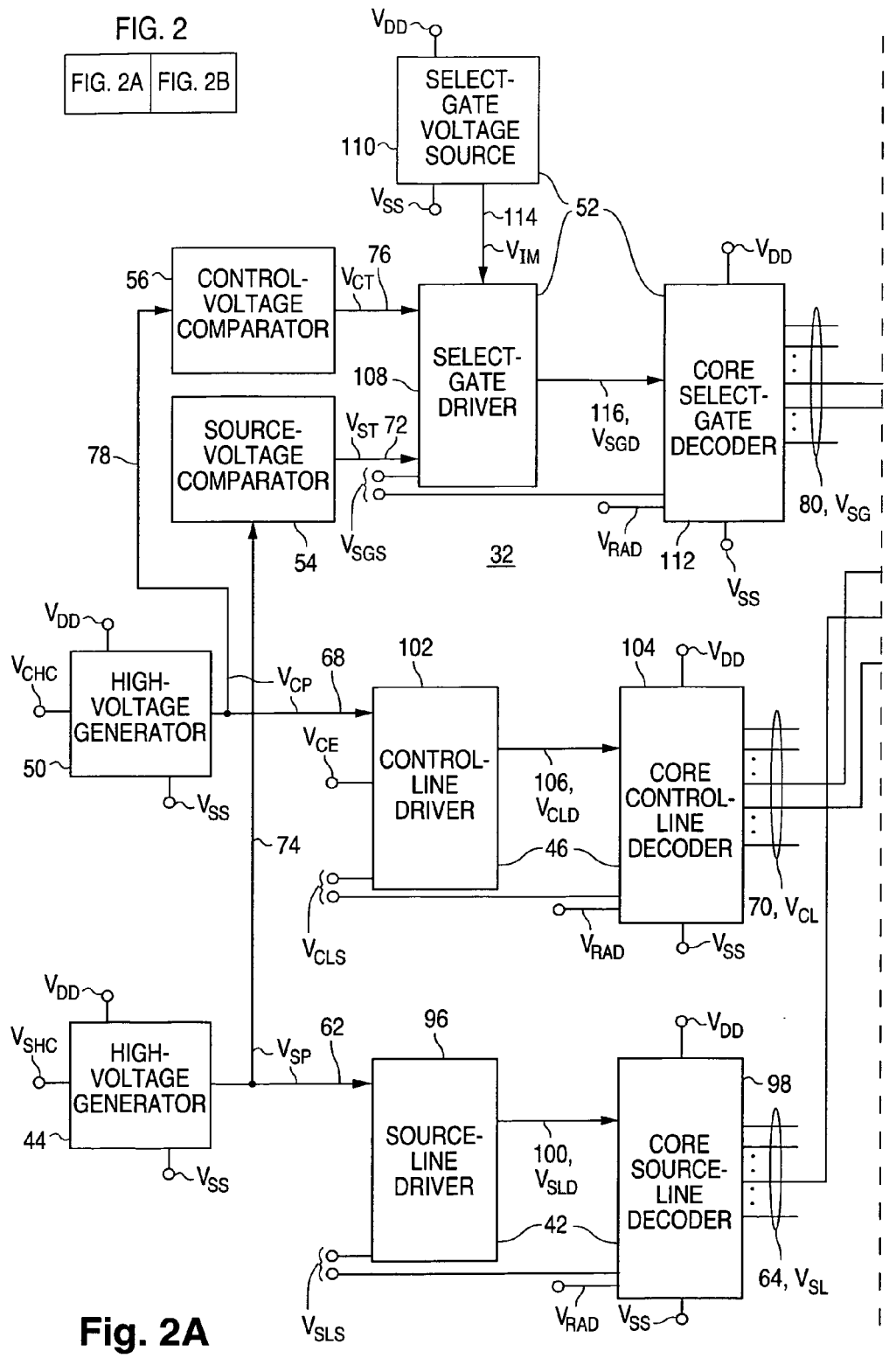
FIG. 2 is a block/circuit diagram of an implementation of part of the EPROM of FIG. 1.
Figure 2B:
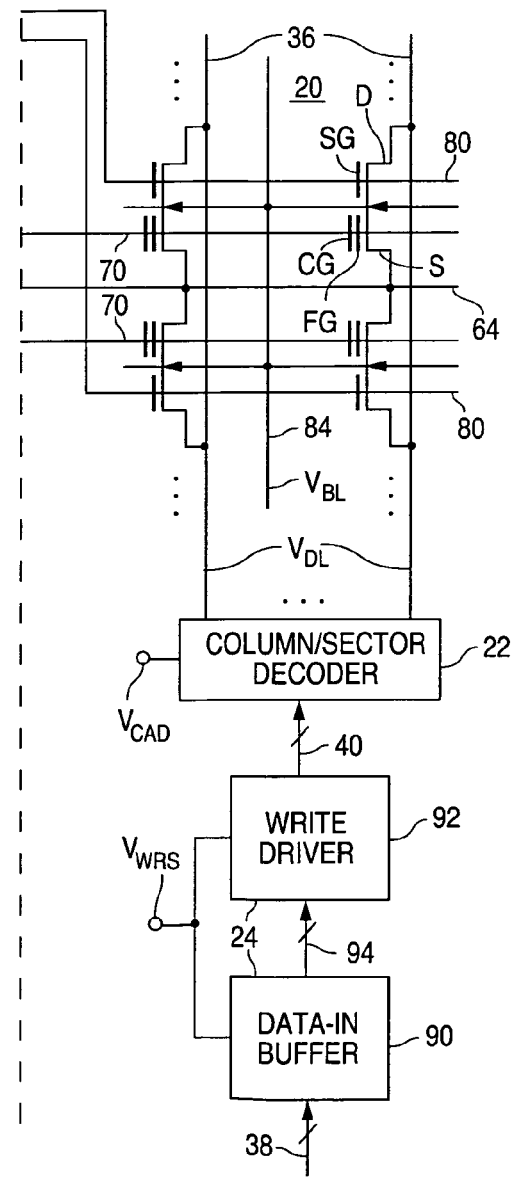

FIG. 1 illustrates part of a flash EPROM configured in accordance with the invention to avoid programming disturbances and unnecessary power consumption during programming operations. FIG. 2 depicts a partial implementation of the EPROM of FIG. 1 and further shows the basic architecture of the control circuitry that achieves the above-mentioned advantages of the invention.

The core of the EPROM circuitry in FIGS. 1 and 2 is a multiplicity of largely identical memory cells 20 arranged in rows and columns. Two memory cells 20 are shown in FIG. 1 while four cells 20 are shown in FIG. 2. Cells 20 respectively store bits of data where each bit is either a high logic "1" or a low logic "0".

All of cells 20 in each of FIGS. 1 and 2 are simultaneously erasable to logic "1". Cells 20 in each of FIGS. 1 and 2, along with the associated local lines and circuitry, thereby form one of the above-mentioned simultaneously erasable EPROM sectors. FIGS. 16 and 17, described below, illustrate how the EPROM is divided into a set of mats where each mat contains an array of the EPROM sectors.

Figure 3:
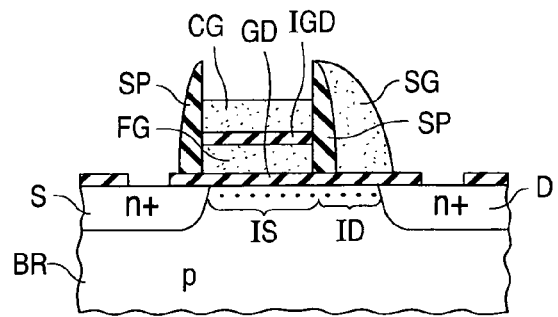
FIG. 3 is a cross-sectional side view of an embodiment of a triple-gate split-gate floating-gate FET employed as a memory cell in the EPROM of FIGS. 1 and 2.

Each memory cell 20 is implemented with a memory element consisting of an n-channel triple-gate split-gate floating-gate FET whose programmable threshold voltage is varied during memory operation for storing a logic "1" or a logic "0". As further shown in FIG. 3, each floating-gate memory FET 20 has a pair of heavily doped n-type source/drain regions S and D laterally separated from each other by a channel portion of a p-type body region BR of a semiconductor body. Body region BR forms a pn junction with each of source/drain regions S and D. Regions S and D respectively function as source and drain during read operations and, for convenience, are hereafter referred to respectively as source S and drain D even though they sometimes, e.g., during programming operations, respectively function as drain and source.

A floating-gate electrode (again, often simply "floating gate") FG overlies the channel portion of body region BR and is separated from the semiconductor body, including the channel portion, by a gate dielectric layer GD. A control-gate electrode (again, often simply "control gate") CG overlies floating gate FG and is separated from gate FG by an intergate dielectric layer IGD. Dielectric spacers SP are situated along the sidewalls of gates FG and CG. The combination of electrically insulating regions GD, IGD, and SP fully surrounds floating gate FG.

Each floating-gate memory FET 20 has a select-gate electrode (again, often simply "select gate") SG that overlies part of the channel portion to the side of gates FG and CG. Select gate SG is separated from gates FG and CG by one of spacers SP and from the semiconductor body, including the channel portion, by gate dielectric layer GD. Since select gate SG overlies part of the channel portion, gates FG and CG overlie part (another part) of the channel portion. Gate SG extends partially over drain D. Gates FG and CG extend partially over source S.

Floating-gate FETs 20 can be implemented as p-channel devices provided that the polarities of the voltages applied to FETs 20 are largely reversed from those used in n-channel implementations. In that case, the conductivity types of regions S, D, and BR are also reversed. Each FET 20 is either in an erased condition or in a programmed condition dependent on the value of that FET's programmable threshold voltage.

A floating-gate FET 20 implemented as an n-channel device is in the erased condition when its programmable threshold voltage is less than first transition value $V_{T1}$ which can be positive, zero, or negative. An FET 20 implemented as a p-channel device is in the erased condition when its programmable threshold voltage is greater than $-V_{T1}$. Analogous to $V_{T1}$, $-V_{T1}$ can be negative, zero, or positive. An FET 20 in the erased condition stores a logic "1".

A floating-gate FET 20 implemented as an n-channel device is in the programmed condition when its programmable threshold voltage is greater than positive second transition value $V_{T2}$. In addition to being greater than zero, second transition value $V_{T2}$ is greater than or equal to first transition value $V_{T1}$. An FET 20 implemented as a p-channel device is in the programmed condition when its programmable threshold voltage is less than $-V_{T2}$. Since $V_{T2}$ is positive and greater than or equal to $V_{T1}$, $-V_{T2}$ is negative and less than (more negative than) or equal to $-V_{T1}$. An FET 20 in the programmed condition stores a logic "0".

Second transition value $V_{T2}$ is normally greater than first transition value $V_{T1}$ so that the two FET conditions are separated by a finite (non-zero) voltage space. In a typical implementation, value $V_{T2}$ is 4–6 V, typically 5 V, while value $V_{T1}$ is −1–1 V, typically 0 V The two FET conditions for each floating-gate FET 20 are physically demarcated by the presence/absence of a primary inversion layer IS in body region BR along the upper semiconductor surface below floating gate FG when a suitable voltage is applied between control gate CG and source S. Primary inversion layer IS adjoins source S and is spaced apart from drain D. With the voltage between control gate CG and source S being at a suitable value (and with region BR being at a suitable potential, e.g., the same potential as source S), inversion layer IS is present in body region BR when FET 20 is in the erased condition and stores a logic "1". Layer IS is absent when FET 20 is in the programmed condition and stores a logic "0". A dotted line is utilized in FIG. 3 to indicate the location of layer IS because it may be present or absent.

The functions provided by source S and drain D in an FET 20 during programming operations are basically opposite to the functions provided during read operations. That is, source S and drain D respectively function as drain and source during programming operations rather than respectively as source and drain. Consequently, primary inversion layer IS also forms when a suitable voltage is applied between control gate CG and drain D. For inversion layer IS to be present, the voltage between control gate CG and either source S or drain D is normally of such a nature that the potential of gate CG is greater than the potential of source S or drain D when FET 20 is an n-channel device and less than the potential of source S or drain D when FET 20 is a p-channel device.

A further inversion layer ID forms below select gate SG of each FET 20 when a suitable voltage is applied between select gate SG and source S. Further inversion layer ID adjoins drain D and is spaced apart from source S. As with primary inversion layer IS, a dotted line is utilized in FIG. 3 to indicate the location of further inversion layer ID because it may be present or absent. When source S and drain D respectively function as drain and source, inversion layer ID also forms when a suitable voltage is applied between select gate SG and drain D. For layer ID to be present, the voltage between select gate SG and either source S or drain D is normally of such a nature that the potential of gate SG is greater than the potential of source S or drain D when FET 20 is an n-channel device and less than the potential of source S or drain D when FET 20 is a p-channel device.

When both of inversion layers IS and ID are present in an FET 20, layers IS and ID form a composite inversion layer extending from source S of that FET 20 to its drain D. FET 20 is then in the conductive, or on, condition. FET 20 is in the non-conductive, or off, condition when at least one of layers IS and ID is absent.

Floating-gate memory FETs 20 in the EPROM sector of FIGS. 1 and 2 are operated and controlled generally in the following way. Before performing an operation to write data into FETs 20, an erasure operation is performed simultaneously on all of FETs 20 so that they are all in the erased condition at logic "1" with their programmable threshold voltages (a) less than first transition value $V_{T1}$ if, as illustrated in FIG. 2, FETs 20 are of n-channel type or (b) greater than $-V_{T1}$ if FETs 20 are of p-channel type. Part, and potentially all, of FETs 20 may be in the erased condition prior to erasure. Each FET 20, if any, that is not in the erased condition immediately before erasure is thus placed in the erased condition substantially simultaneously as each other FET 20, if any, that is likewise not in the erased condition immediately before erasure.

After erasure is completed, data can be written into the EPROM sector of FIGS. 1 and 2. Writing is accomplished by performing a programming (or programming/write) operation on certain selected ones of floating-gate FETs 20 to place those selected FETs 20 in the programmed condition at logic "0" with their programmable threshold voltages (a) greater than second transition value $V_{T2}$ if FETs 20 are of n-channel type or (b) less than $-V_{T2}$ if FETs 20 are of p-channel type. A programming operation consists of a main programming portion and a discharge portion. At the end of a typical programming operation, some of FETs 20 are typically in the programmed condition at logic "0" while others remain in the erased condition at logic "1". A read operation can then be performed to determine the data stored in various ones of FETs 20.

Floating-gate memory FETs 20 are accessed and controlled through a column/sector decoder 22, a write buffer 24, input/output circuitry/pins 26, sense amplifiers 28, a read buffer 30, and a row/sector decoder 32. Although memory FETs 20 illustrated in FIGS. 1 and 2 are employed in only one EPROM sector, components 22, 24, 26, 28, 30, and 32 service the entire EPROM. The various EPROM components, including decoders 22 and 32, are collectively connected between a source of a high supply voltage $V_{DD}$ and a source of a low supply voltage $V_{SS}$ whose difference defines a supply voltage range $V_{DD}$–$V_{SS}$. High supply voltage $V_{DD}$ is typically 3 V. Low supply voltage $V_{SS}$ is typically 0 V (ground reference).

The configuration and operation of EPROM components 22, 24, 26, 28, 30, and 32 is described below for the illustrated case in which FETs 20 are n-channel devices. The voltage polarities can largely be reversed if FETs 20 are implemented as p-channel devices.

Column/sector decoder 22 is connected to drains D of floating-gate FETs 20 by way of local bit lines 36 that respectively carry bit-line voltage signals $V_{DL}$. Decoder 22 receives column address signals $V_{CAD}$, sector selection signals (not indicated in FIGS. 1 and 2), and various column control signals (also not indicated in FIGS. 1 and 2). When the sector selection signals are set at values that select the EPROM sector illustrated in FIGS. 1 and 2, an erase, programming, or read operation can be performed on FETs 20. For an erase operation, bit-line voltages $V_{DL}$ float on all of bit lines 36 for the illustrated sector.

Data for storage in the EPROM of FIGS. 1 and 2 is provided through input/output circuitry/pins 26 along lines 38 to write buffer 24. In response to a write selection signal $V_{WRS}$, buffer 24 provides the input data on data lines 40 to column/sector decoder 22. When a programming operation is being performed, column/sector decoder 22 provides the data from buffer 24 to selected ones of bit lines 36 in response to column address signals $V_{CAD}$ and the column control signals.

Row/sector decoder 32 selects a row of FETs 20 so that, during a programming operation, the $V_{DL}$ data is programmed into FETs 20 at the intersection of that row and the selected bit lines 36. During a programming operation, bit-line voltage $V_{DL}$ on each selected bit line 36 connected to an FET 20 being programmed to a logic "0" is maintained at a nominal bit-line value equal to $V_{SS}$. Bit-line voltages $V_{DL}$ on all other bit lines 36, both selected and unselected, in the illustrated EPROM sector are raised to a programming-inhibit bit-line value equal to $V_{DD}$ during the main portion of the programming operation and are returned to nominal bit-line value $V_{SS}$ during the discharge portion of the operation. Column/sector decoder 22 in cooperation with write buffer 24 and input/output circuitry/pins 26 constitutes bit-line control circuitry that controls bit-line voltages $V_{DL}$ for programming operations.

For a read operation, row/sector decoder 32 selects a row of FETs 20. Responsive to column address signals $V_{CAD}$ and the column control signals, column/sector decoder 22 provides the data stored in FETs 20 at the intersection of a selected row and selected ones of bit lines 36 to sense amplifiers 28. In response to a read selection signal $V_{RDS}$, sense amplifiers 28 determine (detect and amplify) the data read out of the selected FETs 20 and provide that data to read buffer 30. The data in buffer 30 is outputted through input/output circuitry/pins 26 in response to read selection signal $V_{RDS}$. Further information on a typical implementation of column/sector decoder 22 is presented in Kim, U.S. patent application Ser. No. 10/640,929, filed 5 Aug. 2003, the contents of which are incorporated by reference herein.

Row/sector decoder 32 contains a source-line decoder 42, a high-voltage generator 44, a control-line decoder 46, a low-voltage generator 48, a high-voltage generator 50, a select-gate decoder 52, a source-voltage comparator 54, a control-voltage comparator 56, a body-line decoder 58, and a high-voltage generator 60.

Source-line decoder 42 is connected to high-voltage generator 44 via a line 62 for receiving a programming source voltage signal $V_{SP}$ that reaches a programming source value $V_{SPH}$ considerably greater than $V_{DD}$. Programming source value $V_{SPH}$ is typically 3 V above $V_{DD}$ and thus typically 6 V above $V_{SS}$. Generator 44, normally implemented as a charge pump, generates programming source voltage $V_{SP}$ in response to a generator control signal $V_{SHC}$. During a programming operation, generator 44 raises programming source voltage $V_{SP}$ from $V_{DD}$ to $V_{SPH}$ when control signal $V_{SHC}$ goes to a suitable programming-initiation value to begin the main portion of the operation. Generator 44 returns voltage $V_{SP}$ to $V_{DD}$ when signal $V_{SHC}$ goes to a programming-termination value to begin the discharge portion of the programming operation.

Source-line decoder 42 also receives row address signals $V_{RAD}$ and source-line selection (or selection/control) signals $V_{SLS}$. Row address signals $V_{RAD}$ are normally generated in such a manner that only one row of memory FETs 20 is selected for a programming or read operation at that time. Programming, erase, read, sector choice, and other control functions are selected by providing selection signals $V_{SLS}$ at suitable values.

Responsive to row address signals $V_{RAD}$, source-line selection signals $V_{SLS}$, and source programming voltage $V_{SP}$, source-line decoder 42 provides source-line programming voltage signals $V_{SL}$ respectively on local source lines 64. Some of source lines 64 are local to the EPROM sector illustrated in FIGS. 1 and 2 whereas others are local to other EPROM sectors. Each source line 64 for the illustrated sector is connected to sources S of FETs 20 in one or more, typically four, rows of FETs 20 for providing an associated one of source-line programming voltages $V_{SL}$ to those sources S. Decoder 42 in cooperation with generator 44 constitutes source-line control circuitry that controls source-line voltages $V_{SL}$.

With source-line selection signals $V_{SLS}$ set at values that select the illustrated EPROM sector, further setting signals $V_{SLS}$ at values that select programming causes source-line decoder 42 to electrically connect line 62 to a selected one of source lines 64. As programming source voltage $V_{SP}$ rises from $V_{DD}$ to high programming source value $V_{SPH}$ during the main portion of a programming operation, this connection causes source-line voltage $V_{SL}$ on selected source line 64 to rise from a nominal source-line value equal to $V_{SS}$ up to a high programming source-line value largely equal to $V_{SPH}$ during the main programming portion. For convenience, the high programming value of voltage $V_{SL}$ on selected line 64 is referred to here as $V_{SPH}$ even though line losses typically cause the high $V_{SL}$ programming value to be slightly less than $V_{SPH}$. Voltage $V_{SL}$ on selected line 64 returns to nominal source-line value $V_{SS}$ during the discharge portion of the programming operation. Voltages $V_{SL}$ on all other source lines 64 in the illustrated EPROM sector remain at nominal value $V_{SS}$ during the programming operation.

Setting source-line selection signals $V_{SLS}$ at values that select erasure for the EPROM sector illustrated in FIGS. 1 and 2 causes source-line decoder 42 to become effectively electrically disconnected from source lines 64 for the illustrated sector. Consequently, source-line voltages $V_{SL}$ on lines 64 for the illustrated sector float during erasure. When signals $V_{SLS}$ are set at values that select read, voltages $V_{SL}$ are at $V_{SS}$ on all lines 64 in the illustrated sector.

Control-line decoder 46 is connected to low-voltage generator 48 via a line 66 for receiving an erasure control voltage signal $V_{CE}$ that reaches a low erasure control value $V_{CEL}$ considerably below $V_{SS}$. Erasure control value $V_{CEL}$ is typically 10 V below $V_{SS}$. Generator 48, normally implemented with a charge pump, generates erasure control voltage $V_{CE}$ in response to a generator control signal $V_{CLC}$. In producing erasure control voltage $V_{CE}$, generator 48 may interact with bit-line decoder 58 and high-voltage generator 60 as described in Park, co-filed U.S. patent application Ser. No. 10/780,030, the contents of which are incorporated by reference herein.

Control-line decoder 46 is connected to high-voltage generator 50 via a line 68 for receiving a programming control voltage $V_{CP}$ that reaches a high programming control value $V_{CPH}$ considerably greater than $V_{DD}$. Programming control value $V_{CPH}$ is typically 7 V above $V_{DD}$ and thus typically 10 V above $V_{SS}$. Generator 50, normally implemented with a charge pump, generates programming control voltage $V_{CP}$ in response to a generator control signal $V_{CHC}$. During a programming operation, generator 50 raises programming control voltage $V_{CP}$ from $V_{DD}$ to $V_{CPH}$ when control signal $V_{CHC}$ goes to a suitable programming-initiation value to begin the main programming portion. Generator 50 returns voltage $V_{CP}$ to $V_{DD}$ when control signal $V_{CHC}$ goes to a programming-termination value to begin the discharge portion of the operation.

Control-line decoder 46 also receives row address signals $V_{RAD}$ and control-line selection (or selection/control) signals $V_{CLS}$. Programming, erase, read, sector choice, and other control functions are selected or performed by providing selection signals $V_{CLS}$ at suitable values.

Responsive to row address signals $V_{RAD}$, control-line selection signals $V_{CLS}$, erasure control voltage $V_{CE}$, and programming control voltage $V_{CP}$, control-line decoder 46 provides control-line (or control-gate or simply control) programming/erasure voltage signals $V_{CL}$ respectively on local control lines 70. Some of lines 70 are local to the EPROM sector illustrated in FIGS. 1 and 2 while other lines 70 are local to other EPROM sectors. Each control line 70 for the illustrated EPROM sector is connected to control gates CG in one or more, typically four, rows of FETs 20 for providing an associated one of control-line programming/erasure voltages $V_{CL}$ to those gates CG. Each cell row connected to a particular control line 70 is connected to a different source line 64. Decoder 46 in cooperation with generators 48 and 50 constitutes control-line (or control-gate) control circuitry that controls control-line voltages $V_{SG}$.

When control-line selection signals $V_{CLS}$ are set at values that select the illustrated EPROM sector, further setting signals $V_{CLS}$ at values that select programming causes control-line decoder 46 to electrically connect line 68 to a selected one of control lines 70. As programming control voltage $V_{CP}$ rises from $V_{DD}$ up to high programming control value $V_{CPH}$ during the main portion of a programming operation, control-line voltage $V_{CL}$ on selected control line 70 thereby rises from a nominal control value equal to $V_{SS}$ up to a high programming control value largely equal to $V_{CPH}$ during the main programming portion. For convenience, the high programming value of voltage $V_{CL}$ on selected line 70 is referred to here as $V_{CPH}$ even though line losses typically cause the high $V_{SL}$ programming value to be slightly less than $V_{CPH}$. Voltage $V_{CL}$ on selected line 70 returns to nominal control value $V_{SS}$ during the discharge portion of the programming operation. Control-line voltages $V_{CL}$ on all other control lines 70 in the illustrated EPROM sector remain at nominal value $V_{SS}$ during the programming operation.

With source-line selection signals $V_{SLS}$ and control-line selection signals $V_{CLS}$ being simultaneously set at values that select programming for the illustrated EPROM sector, source-line voltage $V_{SL}$ is provided at high programming value $V_{SPH}$ on source line 64 connected (a) to FETs 20 in a selected cell row that also receives control-line voltage $V_{CL}$ at high programming value $V_{CPH}$ and (b) typically to three other cell rows which differ from the additional three cell rows that receive programming value $V_{CPH}$ at the same time as the selected cell row. As determined by bit-line voltages $V_{DL}$ on bit lines 36, certain of FETs 20 in the selected cell row undergo programming to logic "0". No FET 20 in any of the other rows undergoes programming to logic "0" because none of them receives both of high programming values $V_{SPH}$ and $V_{CPH}$ at the same time as the selected row.

Setting control-line selection signals $V_{CLS}$ at values that select erasure for the EPROM sector illustrated in FIGS. 1 and 2 causes control-line voltages $V_{CL}$ to go from $V_{SS}$ down to low erasure value $V_{CEL}$ on all control lines 70 in the illustrated EPROM sector. Voltages $V_{CL}$ on lines 70 in the illustrated sector later return to $V_{SS}$ to complete the erasure. When selection signals $V_{CLS}$ are set at values that select read, control-line voltage $V_{CL}$ goes to $V_{DD}$ on line 70 for the selected cell row and, in the preferred embodiment, for three other cell rows. Voltages $V_{CL}$ remain at $V_{SS}$ on all other lines 70 during the read operation.

Select-gate decoder 52 is connected to source-voltage comparator 54 via a line 72 for receiving a source-voltage percentage-target-attainment voltage signal $V_{ST}$. Comparator 54 generates source-voltage percentage-target-attainment voltage $V_{ST}$ in response to programming source voltage $V_{SP}$ furnished on a line 74 connected through line 62 to high-voltage generator 44. Comparator 54 compares programming source voltage $V_{SP}$ to a source-voltage percentage-target-reference voltage $V_{SRF}$ that exceeds nominal source-line value $V_{SS}$ by a specified percentage of the voltage distance from nominal value $V_{SS}$ to a target value $V_{SPT}$ of high programming source value $V_{SPH}$. Source-voltage percentage-target reference voltage $V_{SRF}$ equals nominal value $V_{SS}$ plus 50–90%, preferably 75–85%, typically 80%, of voltage difference $V_{SPT}$–$V_{SS}$. When programming source voltage $V_{SP}$ reaches percentage-target reference voltage $V_{SRF}$, comparator 54 supplies percentage-target-attainment voltage $V_{ST}$ at a suitable value to indicate attainment of the $V_{SPT}$ target.

Select-gate decoder 52 is connected to control-voltage comparator 56 via a line 76 for similarly receiving a control-line percentage-target-attainment voltage signal $V_{CT}$. Comparator 56 furnishes control-voltage percentage-target-attainment voltage $V_{CT}$ in response to programming control voltage $V_{CP}$ furnished on a line 78 connected through line 68 to high-voltage generator 50. Comparator 56 compares programming control voltage $V_{CP}$ to a control-voltage percentage-target reference voltage $V_{CRF}$ that exceeds nominal control value $V_{SS}$ by a specified percentage of the voltage distance from nominal value $V_{SS}$ to a target value $V_{CPT}$ of high programming control value $V_{CPH}$. Control-voltage percentage-target reference voltage $V_{CRF}$ equals nominal value $V_{SS}$ plus 50–90%, preferably 75–85%, typically 80%, of voltage difference $V_{CPT}$-$V_{SS}$. When programming control voltage $V_{CP}$ reaches percentage-target reference voltage $V_{CRF}$, comparator 56 provides percentage-target-attainment voltage $V_{CT}$ at a suitable value to indicate achievement of the $V_{CPT}$ target.

For the above-mentioned typical conditions in which programming values $V_{SPH}$ and $V_{CPH}$ are respectively 6 and 10 V above $V_{SS}$, programming source target value $V_{SPT}$ and programming control target value $V_{CPT}$ are typically likewise respectively 6 and 10 V above $V_{SS}$. At the 80% ($V_{SPT}$-$V_{SS}$) target percentage, source-voltage percentage-target reference voltage $V_{SRF}$ is typically 4.5–5 V above $V_{SS}$. Control-voltage percentage-target reference voltage $V_{CRF}$ is typically 8 V above $V_{SS}$ at the 80% ($V_{CPT}$-$V_{SS}$) target percentage.

Select-gate decoder 52 also receives row address signals $V_{RAD}$ and select-gate selection (or selection/control) signals $V_{SGS}$. Programming, erase, read, sector choice, and other control functions are selected or performed by providing selection signals $V_{SGS}$ at suitable values.

Responsive to row address signals $V_{RAD}$, select-gate selection signals $V_{SGS}$, and percentage-target-attainment voltages $V_{ST}$ and $V_{CT}$, select-gate decoder 52 provides select-gate (or select) row-selection voltage signals $V_{SG}$ respectively on global word lines 80 respectively corresponding to the rows of FETs 20. Word lines 80 are global to the group of EPROM sectors that form a mat. Some of lines 80 typically go to EPROM sectors other than the sector illustrated in FIGS. 1 and 2. Each word line 80 for the illustrated sector is connected to select gates SG of FETs 20 in a different cell row. Decoder 52 in cooperation with comparators 54 and 56 constitutes select-gate control circuitry that controls select-gate voltages $V_{SG}$.

With select-gate selection signals $V_{SGS}$ being set at values that select the illustrated EPROM sector, further setting signals $V_{SGS}$ at values that select programming causes select-gate voltage $V_{SG}$ on word line 80 for a selected row of FETs 20 to go from a nominal select value equal to $V_{SS}$ up to an intermediate programming-enable select voltage $V_{ITM}$ during the main portion of a programming operation. Voltage $V_{SG}$ on word line 80 for the selected cell row returns to nominal select value $V_{SS}$ during the discharge portion of the operation. Voltages $V_{SG}$ on all other word lines 80 remain at nominal select value $V_{SS}$ during the programming operation.

Intermediate programming-enable value $V_{ITM}$ lies between $V_{SS}$ and $V_{DD}$, and typically is somewhat closer to $V_{DD}$. More particularly, each FET 20 in an n-channel implementation is effectively the series combination of (a) an n-channel floating-gate FET formed with source S, drain D, floating gate FG, and control gate CG and (b) a regular n-channel insulated-gate FET formed with source S, drain D, and select gate SG. The regular FET has a fixed threshold voltage whose value is typically 0.7–1.0 V. Inversion layer ID forms in the regular FET when the voltage at select gate SG exceeds the voltage at source S or drain D by at least the fixed threshold voltage. Layer ID is otherwise absent. The $V_{ITM}$ value is chosen such that the difference $V_{ITM}$-$V_{SS}$ exceeds the fixed threshold voltage of the regular FET. Also, programming-enable value $V_{ITM}$ needs to be less than the programming-inhibit value, i.e., $V_{DD}$, of bit-line voltages $V_{BL}$ on bit lines 36. These requirements are typically achieved by choosing value $V_{ITM}$ to be 2 V above $V_{SS}$ and thus 1 V below $V_{DD}$.

Setting select-gate selection signals $V_{SGS}$ at values that select erasure for the EPROM sector illustrated in FIGS. 1 and 2 causes select-gate voltages $V_{SG}$ to go from $V_{SS}$ up to $V_{ITM}$ on all word lines 80 in the illustrated EPROM sector. Voltages $V_{SG}$ on all lines 80 in the illustrated sector later return to $V_{SS}$ to complete the erasure operation. When selection signals $V_{SGS}$ are set at values that select read, voltage $V_{SG}$ goes to $V_{DD}$ on word line 80 for the selected cell row. Voltages $V_{SG}$ remain at $V_{SS}$ on all other lines 80 during the read operation.

Body-line decoder 58 is connected to high-voltage generator 60 via a line 82 for receiving an erasure body voltage signal $V_{BE}$ that reaches a high erasure body value $V_{BEH}$ considerably greater than $V_{DD}$. Erasure body value $V_{BEH}$ is typically 5 V above $V_{DD}$ and thus typically 8 V above $V_{SS}$. Generator 60, normally implemented with a charge pump, generates erasure body value $V_{BE}$ in response to a generator control signal $V_{BHC}$. In producing erasure body voltage $V_{BE}$, generator 58 may interact with control-line decoder 46 and low-voltage generator 48 as described in Park, U.S. patent application Ser. No. 10/780,030, cited above.

In addition to erasure body voltage $V_{BE}$, body-line decoder 58 receives body-line selection (or selection/control) signals $V_{BLS}$. Programming, erase, read, sector choice, and other control functions are selected or performed by providing selection signals $V_{BLS}$ at suitable values.

Using erasure body voltage $V_{BE}$ and low supply voltage $V_{SS}$, body-line decoder 58 provides body-line voltage signals $V_{BL}$ respectively on sector body lines 84 in response to body-line selection signals $V_{BLS}$. Each body line 84 is connected to body regions BR, including their channel portions, of all the memory cells in an associated (different) one of the EPROM sectors. Hence, one line 84 is connected to regions BR of all FETs 20 in the illustrated sector.

Each body-line voltage $V_{BL}$ settles at $V_{BEH}$ or $V_{SS}$ during EPROM operation. When body-line selection signals $V_{BLS}$ are at values that select programming for the EPROM sector of FIGS. 1 and 2, body-line voltage $V_{BL}$ is provided at $V_{SS}$ on body line 84 to body regions BR of all FETs 20 in the illustrated sector. The same occurs during a read operation. During erasure, voltage $V_{BL}$ is provided at $V_{BEH}$ on line 84 to regions BR of FETs 20 in the illustrated sector.

Body-line decoder 58 and high-voltage generator 60 have been described here as parts of row/sector decoder 32 due to the typical interaction of decoder 58 and generator 60 with control-line decoder 46 and low-voltage generator 48. However, body-line decoder 58 does not receive row address signals $V_{RAD}$. Alternatively, decoder 58 could be viewed as part of both column/sector decoder 22 and row/sector decoder 32. Since decoder 58 does not receive column address signals $V_{CAD}$, decoder 58 could also be viewed as separate from each of decoders 22 and 32.

Source-line decoder 42, control-line decoder 46, select-gate decoder 52, and body-line decoder 58 have been described here, and illustrated in FIGS. 1 and 2, as separate decoders. However, source-line decoder 42 and control-line decoder 46 operate in synchronism. Part of the circuitry that processes row address signals $V_{RAD}$ in decoder 46 can be same as part of the circuitry that processes signals $V_{RAD}$ in decoder 42. One of control-line selection signals $V_{CLS}$ is one of source-line selection signals $V_{SLS}$. Accordingly, the total amount of circuitry needed for decoders 42, 46, 52, and 58 can be reduced by partially merging them together. Additionally, high-voltage generators 44, 50, and 58 can partially utilize common circuitry. The total amount of circuitry can be further reduced by similarly merging generators 44, 50, and 58 partially together.

Referring particularly to FIG. 2, write buffer 24 consists of a data-in buffer 90 and a write driver 92. Data-in buffer 90 stores the input data received on lines 38 from input/output circuitry/pins 26 (not shown in FIG. 2). Responsive to write selection signal $V_{WRS}$, buffer 90 provides the stored data to write driver 92 via lines 94 during programming operations.

Write driver 92 converts the stored data into appropriate voltage signals that are provided on data lines 40 to column/sector decoder 22 for decoding to produce bit-line voltages $V_{DL}$ on bit lines 36. Responsive to write selection signal $V_{WRS}$ and dependent on the data values, write driver 92 causes the voltages on selected ones of data lines 40 to switch between $V_{SS}$ and $V_{DD}$ at selected times coordinated with the timing provided by row/sector decoder 32. At an appropriate selected time during the main portion of a programming operation, bit-line voltage $V_{DL}$ thus goes from $V_{SS}$ to $V_{DD}$ on each bit line 36 whose FET 20 in the selected cell row is to remain in the erased condition. At a later appropriate time during the discharge portion of the operation, voltage $V_{DL}$ on each such bit line 36 returns to $V_{SS}$. Voltage $V_{DL}$ is maintained at $V_{SS}$ during the programming operation on each bit line 36 whose FET 20 in the selected cell row is to undergo programming.

Source-line decoder 42 is formed with a source-line driver 96 and a core source-line decoder 98. In response to programming source voltage $V_{SP}$ and certain of source-line selection signals $V_{SLS}$, source-line driver 96 drives a line 100 that carries a source-line driver voltage signal $V_{SLD}$ supplied to core source-line decoder 98. Driver 96 causes source-line driver voltage $V_{SLD}$ to go from $V_{SS}$ to $V_{SPH}$ at a selected time during the main portion of a programming operation and to return to $V_{SS}$ at a later selected time during the discharge portion. Responsive to driver voltage $V_{SLD}$ and certain of selection signals $V_{SLS}$, core decoder 98 decodes row address signals $V_{RAD}$ to produce source-line voltages $V_{SL}$.

Control-line decoder 46 consists of a control-line driver 102 and a core control-line decoder 104. In response to programming control voltage $V_{CP}$, erasure control voltage $V_{CE}$, and certain of control-line selection signals $V_{CLS}$, control-line driver 102 drives a line 106 that carries a control-line driver voltage signal $V_{CLD}$ provided to core control-line decoder 104. Driver 102 causes control-line driver voltage $V_{CLD}$ to go from $V_{SS}$ to $V_{CPH}$ at a selected time during the main portion of a programming operation and to return to $V_{SS}$ at a later selected time during the discharge portion. Responsive to driver voltage $V_{CLD}$ and certain of selection signals $V_{CLS}$, core decoder 104 decodes row address signals $V_{RAD}$ to produce control-line voltages $V_{CL}$.

Select-gate decoder 52 is formed with a select-gate driver 108, a select-gate voltage source 110, and a core select-gate decoder 112. Select-gate driver 108 is connected to select-gate voltage source 110 via a line 114 for receiving an intermediate voltage signal $V_{IM}$. Voltage source 110, typically implemented as a voltage regulator, provides intermediate voltage $V_{IM}$ at an approximately constant value equal to $V_{ITM}$.

Responsive to source-voltage percentage-target-attainment voltage $V_{ST}$, control-voltage percentage-target-attainment voltage $V_{CT}$, and certain of select-gate selection signals $V_{SGS}$, select-gate driver 108 drives a line 116 that carries a select-gate driver voltage signal $V_{SGD}$ provided to core select-gate decoder 112. Driver 108 causes select-gate driver voltage $V_{SGD}$ to go from $V_{SS}$ to $V_{ITM}$ at a selected time during the main portion of a programming operation and to return to $V_{SS}$ at a later selected time during the discharge portion. Responsive to driver voltage $V_{SGD}$ and certain of selection signals $V_{SGS}$, core decoder 112 decodes row address signals $V_{RAD}$ to produce select-gate voltages $V_{SG}$.

Figure 4:
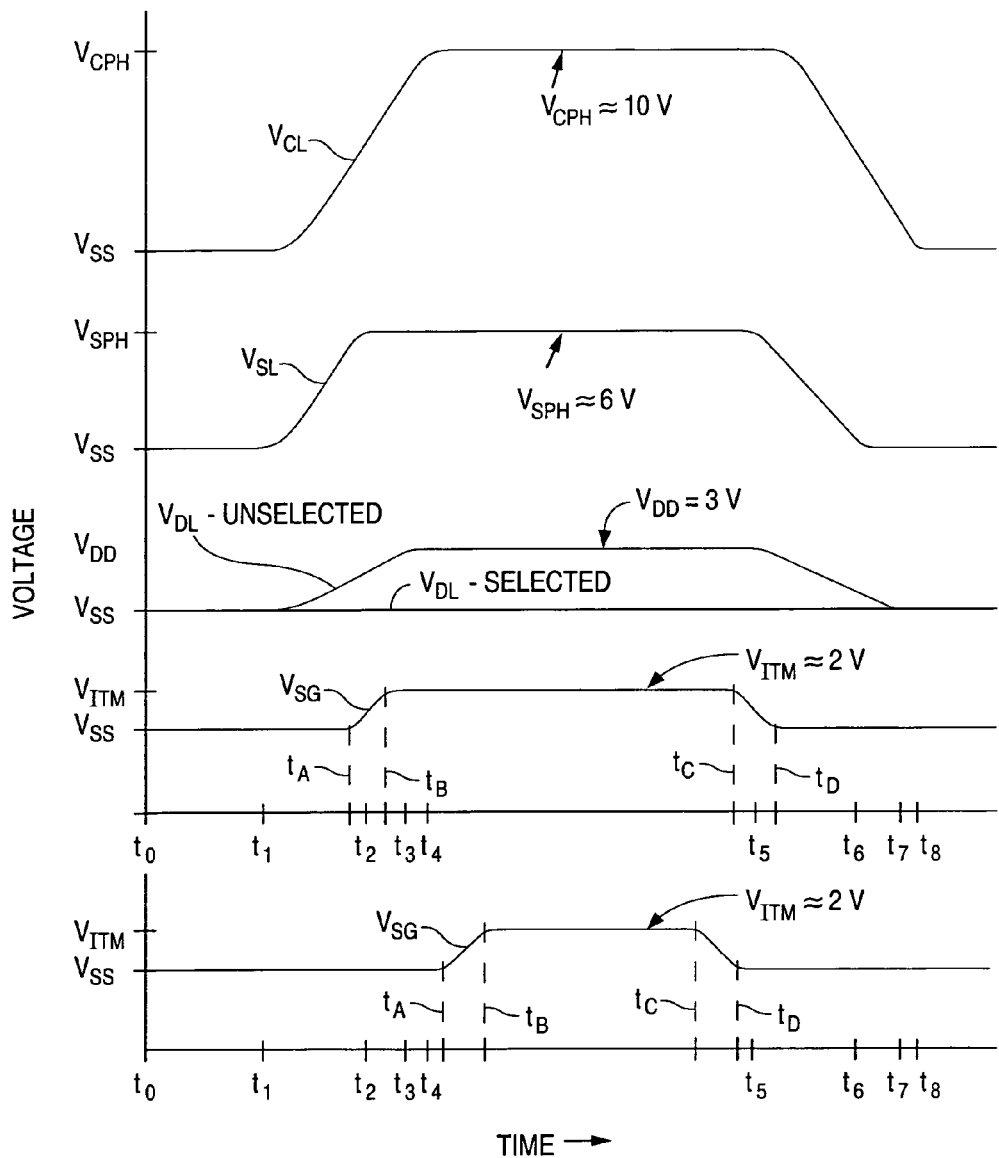
FIGS. 4–6, 8, 10, and 12 are timing diagrams for certain voltages in the EPROM of FIGS. 1 and 2.
Figure 5:
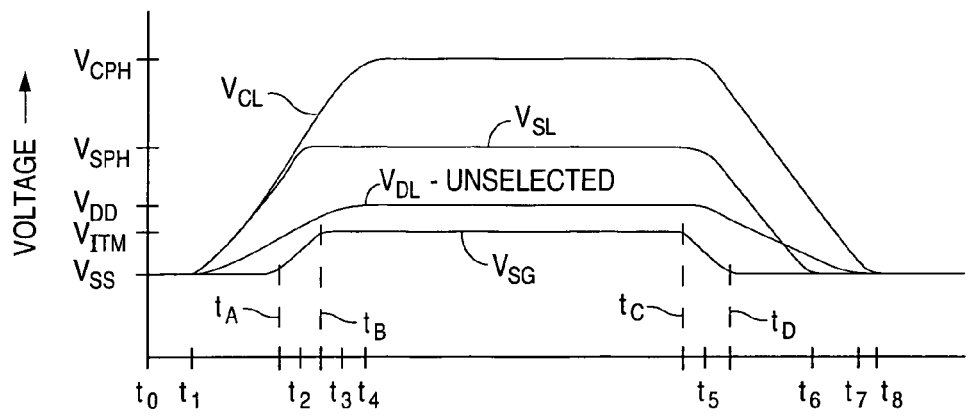

With the foregoing in mind, an understanding of how column/sector decoder 22, source-line decoder 42, control-line decoder 46, and select-gate decoder 52 cooperate in performing a programming operation according to the invention is facilitated with the assistance of the voltage timing curves shown in FIGS. 4 and 5. FIG. 4 illustrates an example of how control-line voltage $V_{CL}$ and source-line voltage $V_{SL}$ for a selected cell row vary during a programming operation and how bit-line voltage $V_{DL}$ varies on two bit lines 36, one labeled as "SELECTED" and the other labeled as "UNSELECTED". FIG. 4 also illustrates two examples of how select-gate voltage $V_{SG}$ for the selected cell row varies during the programming operation. FIG. 5 presents a merged composite of the $V_{SL}$, $V_{CL}$, UNSELECTED $V_{DL}$, and upper $V_{SG}$ curves in FIG. 4.

A programming operation is performed on a selected group, e.g., 8 for a byte and 16 for a word, of FETs 20 in a selected row of FETs 20. All of FETs 20 in the selected cell group are initially in their erased conditions. Each FET 20 in the selected group is either intended to go into its programmed condition, as represented by the SELECTED $V_{DL}$ curve in FIG. 4, or to remain in its erased condition, as represented by the UNSELECTED $V_{DL}$ curve in FIGS. 4 and 5. Column decoder 22 selects (or designates) the selected cell group by electrically connecting data lines 40 respectively to bit lines 36 for the selected cell group.

A "selected" FET 20 here means an FET 20 which is in the selected group of a selected row of FETs 20 and which is intended to go into the programmed condition during a programming operation performed on the selected cell group. An "unselected" FET 20 here means an FET 20 which is in the selected cell group and which is intended to remain in the erased condition during the programming operation on the selected cell group. FETs 20 in the selected row outside the selected cell group are often referred to here as "unselected" FETs 20 because none of them is intended to be placed in the programmed condition during the programming operation performed on FETs 20 in the selected cell group. Some of unselected FETs 20 outside the selected cell group may, however, have been placed in the programmed condition during one or more earlier programming operations.

The EPROM of FIGS. 1 and 2 is prepared for a programming operation by placing selection signals $V_{SLS}$, $V_{CLS}$, $V_{SGS}$, and $V_{BLS}$, along with the control signals (not shown) to column/sector decoder 22, at values that select programming for the EPROM sector illustrated in FIGS. 1 and 2. The preparation for programming is completed at or before initial time $t_0$. Source-line voltages $V_{SL}$, control-line voltages $V_{CL}$, select-gate voltages $V_{SG}$, and bit-line voltages $V_{DL}$ for the selected sector along with the sector's body-line voltage $V_{BL}$ (not shown in FIG. 4 or 5) are all initially at $V_{SS}$. Body-line voltage $V_{BL}$ remains at $V_{SS}$ during the entire programming operation.

The programming operation starts at time $t_1$ with the main programming portion. At least one of the following three events occurs at time $t_1$: (a) source-line voltage $V_{SL}$ on source line 64 for a selected row of FETs 20 starts going from nominal source-line value $V_{SS}$ up to high programming source-line value $V_{SPH}$, (b) control-line voltage $V_{CL}$ on control line 70 for the selected cell row starts going from nominal control value $V_{SS}$ up to high programming control value $V_{CPH}$, and (c) bit-line voltages $V_{DL}$ on bit lines 36 connected to unselected FETs 20 start going from nominal bit-line value $V_{SS}$ up to programming-inhibit bit-line value $V_{DD}$. Event (c) covers bit-line voltages $V_{DL}$ on unselected FETs 20 outside the selected cell group as well as any unselected FET 20 in the selected cell group. In the exemplary timing diagrams of FIGS. 4 and 5, events (a)–(c) all occur largely at time $t_1$.

At time $t_A$ after all of events (a)–(c) have occurred, select-gate voltage $V_{SG}$ on word line 80 for the selected row of FETs 20 starts going from nominal select value $V_{SS}$ up to programming-enable select value $V_{ITM}$. Select-gate voltage $V_{SG}$ for the selected cell row, generally referred to here as the "selected select-gate voltage $V_{SG}$", substantially reaches $V_{ITM}$ at time $t_B$. Source-line voltage $V_{SL}$ for the selected row, generally referred to here as the "selected source-line voltage $V_{SL}$", substantially reaches $V_{SPH}$ at time $t_2$. Bit-line voltage $V_{DL}$ on each bit line 36 connected to an unselected FET 20, generally referred to here as each "unselected bit-line voltage $V_{DL}$", substantially reaches $V_{DD}$ at time $t_3$. Control-line voltage $V_{CL}$ for the selected row, generally referred to here as the "selected control-line voltage $V_{CL}$", substantially reaches $V_{CPH}$ at time $t_4$. The events at times $t_A$, $t_B$, and $t_2$–$t_4$ can occur in various sequences provided that time $t_A$ at which selected select-gate voltage $V_{SG}$ starts to rise occurs after all of events (a)–(c) have occurred with at least one of events (a)–(c) occurring at time $t_1$. For instance, time $t_2$ at which selected source-line voltage $V_{SL}$ reaches $V_{SPH}$ may occur after rather than, as illustrated in FIGS. 4 and 5, before time $t_B$ at which selected select-gate voltage $V_{SG}$ reaches $V_{ITM}$.

Selected source-line voltage $V_{SL}$ and selected control-line voltage $V_{CL}$ normally rise faster than each unselected bit-line voltage $V_{DL}$. Hence, each unselected bit-line voltage $V_{DL}$ can substantially reach $V_{DD}$ at time $t_3$ after selected source-line voltage $V_{SL}$ substantially reaches $V_{SPH}$ at time $t_2$ or/and after selected control-line voltage $V_{CL}$ substantially reaches $V_{CPH}$ at time $t_4$. Selected select-gate voltage $V_{SG}$ also normally rises faster, typically several times faster, than each unselected bit-line voltage $V_{DL}$.

The timing diagram of FIG. 5 and the signal timing that results from the upper $V_{SG}$ curve in FIG. 4 arise from the use of comparators 54 and 56 to generate percentage-target-attainment voltages $V_{ST}$ and $V_{CT}$. In response to voltages $V_{ST}$ and $V_{CT}$, select-gate decoder 52 causes selected select-gate voltage $V_{SG}$ to start going from $V_{SS}$ up to $V_{ITM}$ immediately after both of voltages $V_{ST}$ and $V_{CT}$ change to values indicating that programming source voltage $V_{SP}$ and programming control voltage $V_{CP}$ have respectively reached percentage-target reference voltages $V_{SRF}$ and $V_{CRF}$. This causes selected select-gate voltage $V_{SG}$ to start rising toward $V_{ITM}$ before selected voltages $V_{SL}$ and $V_{CL}$ respectively substantially reach programming values $V_{SPH}$ and $V_{CPH}$. Accordingly, time $t_A$ precedes times $t_2$ and $t_4$ as shown in FIG. 5 and as occurs with the upper $V_{SG}$ curve in FIG. 4.

Comparators 54 and 56 can be deleted from the EPROM of FIGS. 1 and 2. With selected source-line voltage $V_{SL}$, selected control-line voltage $V_{CL}$, and each unselected bit-line voltage $V_{DL}$ all beginning their rises at approximately time $t_1$, selected select-gate voltage $V_{SG}$ starts rising at a selected programming time delay after selected voltages $V_{SL}$ and $V_{CL}$ and each unselected voltage $V_{DL}$ have begun rising. The programming time delay is 1–5 s, typically 2–3 s. Depending on the length of the programming time delay, the timing diagram of FIG. 5 and the timing that results from the upper $V_{SG}$ curve in FIG. 4 can represent the timing that occurs in a variation where comparators 54 and 56 are deleted.

Alternatively, the signal timing that results from utilizing a fixed programming time delay in place of comparators 54 and 56 can be the timing achieved for the lower $V_{SG}$ curve in FIG. 4. That is, selected source-line voltage $V_{SL}$, each unselected bit-line voltage $V_{DL}$, and selected control-line voltage $V_{CL}$ can substantially respectively reach $V_{SPH}$, $V_{DD}$, and $V_{CPH}$ at respective times $t_2$–$t_4$ before selected select-gate voltage $V_{SG}$ starts rising at time $t_A$. In either case, column/sector decoder 22, source-line decoder 42, control-line decoder 46, and select-gate decoder 52 are provided with suitable control circuitry to achieve the desired programming time delay.

Bit-line voltage $V_{DL}$ on each (if any) bit line 36 connected to a selected FET 20, generally referred to here as each "selected bit-line voltage $V_{DL}$", remains substantially at nominal bit-line value $V_{SS}$ during programming operations. As mentioned above, the regular FET formed with source S, drain D, and select gate SG of each FET 20 has a fixed threshold voltage of 0.7–1.0 V. The programming-enable $V_{ITM}$ value, again typically 2 V above $V_{SS}$, which is reached by selected select-gate voltage $V_{SG}$ during a programming operation and which is applied to gate SG of a selected FET 20 thereby exceeds the $V_{SS}$ value applied by selected bit-line voltage $V_{DL}$ to drain D of that FET 20 by more than the fixed threshold voltage of that FET's regular-FET portion. Accordingly, inversion layer ID forms in each selected FET 20 during the programming operation.

The voltage induced on floating gate FG of each selected FET 20 by the $V_{CPH}$ value, again typically 10 V above $V_{SS}$, applied to control gate CG of that FET 20 during a programming operation similarly exceeds the $V_{SS}$ value applied by selected bit-line voltage $V_{DL}$ to that FET's drain D by more than the initial erased value of that FET's programmable threshold voltage. Inversion layer IS then forms in each selected FET 20 so that it turns on during the programming operation. The $V_{SPH}$ value, again typically 6 V above $V_{SS}$, applied by selected source-line voltage $V_{SL}$ to source S of that selected FET 20 considerably exceeds the $V_{SS}$ value applied by selected bit-line voltage $V_{DL}$ to that FET's drain. This creates a high-energy electron flow from drain D of that selected FET 20 to its source S. Due to the high $V_{SPH}$ value at that FET's control gate CG and the resultant high voltage induced on that FET's floating gate FG, some of the high-energy electrons are injected into gate FG of that FET 20 to raise its threshold voltage from the low erasure value to a high programmed value. Accordingly, each selected FET 20 enters the programmed condition during the programming operation.

The signal timing employed during the main portion of a programming operation substantially prevents the voltage, which reaches a maximum of $V_{ITM}$ again typically 2 V above $V_{SS}$, that selected select-gate voltage $V_{SG}$ applies to select gate SG of each unselected FET 20 during the main programming portion from reaching or exceeding the voltage, which reaches a maximum of $V_{DD}$ again typically 3 V above $V_{SS}$, that unselected bit-line voltage $V_{DL}$ applies to drain D of that FET 20 during the main programming portion. Consequently, inversion layer ID does not form in an unselected FET 20 during the programming operation. Unselected FETs 20 remain off. Each unselected FET 20 (if any) in the selected cell group (of the selected cell row) thereby remains in the erased condition. Each unselected FET 20 in the selected cell row outside the selected cell group remains in that FET's prior condition, either erased or programmed if that FET 20 was previously placed in the programmed condition.

The discharge portion of the programming operation represented in FIGS. 4 and 5 begins at time $t_C$ sufficiently after each unselected bit-line voltage $V_{DL}$ has substantially reached $V_{DD}$ at time $t_3$ and also sufficiently after selected voltages $V_{SL}$, $V_{CL}$, and $V_{SG}$ have substantially respectively reached $V_{SPH}$, $V_{CPH}$, and $V_{ITM}$ at respective times $t_2$, $t_4$, and $t_B$. Select-gate voltage $V_{SG}$ on word line 80 for the selected row of FETs 20 starts returning from programming-enable select value $V_{ITM}$ to nominal select value $V_{SS}$ at time $t_C$.

At least one of the following events occurs at time $t_5$ subsequent to time $t_C$: (d) source-line voltage $V_{SL}$ on source line 64 for the selected row of FETs 20 starts to return from high programming source-line value $V_{SPH}$ to nominal source-line value $V_{SS}$, (e) control-line voltage $V_{CL}$ on control line 70 for the selected cell row starts returning from high programming control value $V_{CPH}$ to nominal control value $V_{SS}$, and (f) bit-line voltages $V_{DL}$ on all bit lines 36 connected to unselected FETs 20 start returning from programming-inhibit bit-line value $V_{DD}$ to nominal bit-line value $V_{SS}$. In other words, selected select-gate voltage $V_{SG}$ starts returning to $V_{SS}$ before selected source-line voltage $V_{SL}$, selected control-line voltage $V_{CL}$, and each unselected bit-line voltage $V_{DL}$ all start returning to $V_{SS}$. In the exemplary timing diagrams of FIGS. 4 and 5, events (d)–(f) all occur largely at time $t_5$.

The signal timing for the discharge portion of the programming operation is achieved by appropriately delaying the point at which selected source-line voltage $V_{SL}$, selected control-line voltage $V_{CL}$, and each unselected bit-line voltage $V_{DL}$ start returning to $V_{SS}$ relative to the point at which selected select-gate voltage $V_{SG}$ starts to return to $V_{SS}$. Column/sector decoder 22, source-line decoder 42, control-line decoder 46, and select-gate decoder 52 operate in synchronism to provide the discharge time delay. For the case in which events (d)–(f) all largely occur at time $t_5$, selected voltages $V_{SL}$ and $V_{CL}$ and each unselected voltage $V_{DL}$ all begin their return to $V_{SS}$ at a discharge time delay of 0.1–0.5 s, typically 0.2 s, after selected voltage $V_{SG}$ starts, at time $t_C$, to return to $V_{SS}$.

Selected select-gate voltage $V_{SG}$ substantially reaches $V_{SS}$ at time $t_D$. Selected source-line voltage $V_{SL}$ substantially reaches $V_{SS}$ at time $t_6$. Each unselected bit-line voltage $V_{DL}$ substantially reaches $V_{SS}$ at time $t_7$. Selected control-line voltage $V_{CL}$ substantially reaches $V_{SS}$ at time $t_8$. The events at times $t_D$ and $t_6$–$t_8$ can occur in various sequences provided that selected select-gate voltage $V_{SG}$ starts, at time $t_C$, to return to $V_{SS}$ before any of events of (d)–(f) occur with at least one of events (d)–(f) occurring at time $t_5$.

The timing diagram of FIG. 5 and the timing that results from the upper $V_{SG}$ curve in FIG. 4 represent an example in which selected select-gate voltage $V_{SG}$ substantially reaches $V_{SS}$ at time $t_D$ after selected source-line voltage $V_{SL}$, selected control-line voltage $V_{CL}$, and each unselected bit-line voltage $V_{DL}$ have all started returning, e.g., largely simultaneously at time $t_5$, to $V_{SS}$. In this example, selected select-gate voltage $V_{SG}$ substantially reaches $V_{SS}$ at time $t_5$ before selected voltages $V_{SL}$ and $V_{CL}$ and each unselected voltage $V_{DL}$ all substantially reach $V_{SS}$ at respective times $t_6$–$t_8$. The timing achieved for the lower $V_{SG}$ curve in FIG. 4 represents the opposite example in which selected voltage $V_{SG}$ substantially reaches $V_{SS}$ at time $t_D$ before selected voltages $V_{SL}$ and $V_{CL}$ and each unselected voltage $V_{DL}$ have all started returning, e.g., again largely simultaneously at time $t_5$, to $V_{SS}$. Between these two extremes, selected voltage $V_{SG}$ can substantially reach $V_{SS}$ (at time $t_D$) before either or both of selected voltages $V_{SL}$ and $V_{CL}$ and each unselected voltage $V_{DL}$ have started returning to $V_{SS}$.

The length $t_C$–$t_1$, of the main portion of a programming operation is 10–15 μs, typically 12 μs, for the situation in which percentage-target-attainment voltages $V_{ST}$ and $V_{CT}$ are utilized to enable selected select-gate voltage $V_{SG}$ to start rising at time $t_A$ during the rises of selected voltages $V_{SL}$ and $V_{CL}$. For this situation, the total rise time ($t_1$ to the latest of $t_2$–$t_4$) of selected voltages $V_{SL}$, $V_{CL}$, and $V_{SG}$ and each unselected bit-line voltage $V_{DL}$ is 1–5 μS, typically 2 μs. Hence, selected voltages $V_{SL}$, $V_{CL}$, and $V_{SG}$ and each unselected voltage $V_{DL}$ are jointly at their respective high values $V_{SPH}$, $V_{CPH}$, $V_{ITM}$, and $V_{DD}$ for 8–12 μs, typically 10 μs. The total fall time ($t_C$ to the latest of $t_D$ and $t_6$–$t_8$) of selected voltages $V_{SL}$, $V_{CL}$, $V_{SG}$ and each unselected voltage $V_{DL}$ is 0.5–2 μs, typically 1 μs. This is also the effective length of the discharge portion.

FIGS. 6–13 are timing diagrams that facilitate understanding how the programming technique of the invention avoids programming disturbances and unnecessary power consumption in each unselected one (if any) of a selected group of FETs 20 in a selected cell row during a programming operation performed on the selected cell group. Each unselected FET 20 in the selected cell group is assumed to be in the erased condition prior to the programming operation represented by the timing diagram of each of FIGS. 6–13. The regular FET portion, i.e., the portion formed with source S, drain D, and select gate SG of each unselected FET 20 is assumed to have a fixed threshold voltage of 1 V in the examples of FIGS. 6–13.

FIGS. 6, 8, 10, and 12 illustrate timing curves for selected source-line voltage $V_{SL}$, selected control-line voltage $V_{CL}$, selected select-gate voltage $V_{SG}$, and an unselected bit-line voltage $V_{DL}$ during a programming operation performed on the EPROM of FIGS. 1 and 2 for which selected voltages $V_{SL}$, $V_{CL}$, and $V_{SG}$ and unselected voltage $V_{DL}$ change at various different rates relative to one another. FIGS. 7, 9, 11, and 13 illustrate comparative timing curves in which selected voltages $V_{SL}$, $V_{CL}$, $V_{SG}$, and unselected voltage $V_{DL}$ change during a programming operation at the same respective rates as respectively in FIGS. 6, 8, 10, and 12 but in which selected select-gate voltage $V_{SG}$ starts changing in the rising or falling direction at the same time that selected voltages $V_{SL}$ and $V_{CL}$ and unselected $V_{DL}$ start changing in that direction.

Figure 6:
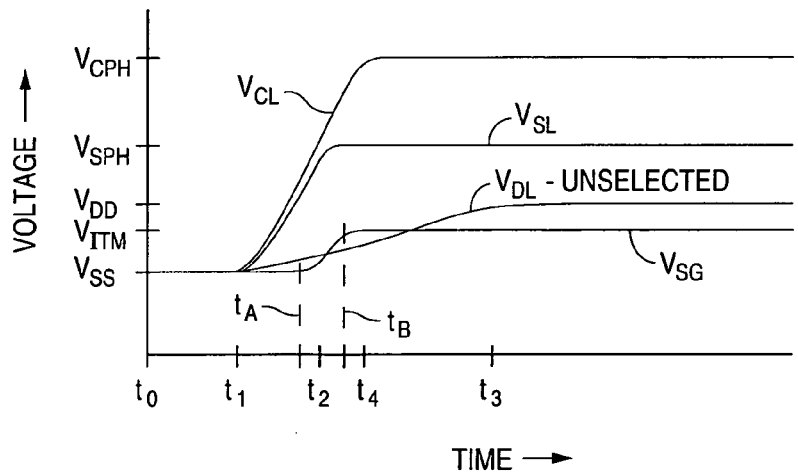
Figure 7:
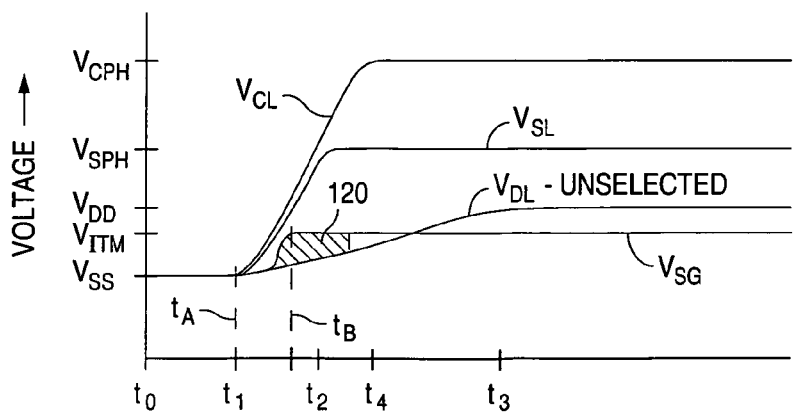
FIGS. 7, 9, 11, and 13 are timing diagrams for comparison with the respective timing diagrams of FIGS. 6, 8, 10, and 12.

FIGS. 6 and 7 deal with the main portion of a programming operation in which unselected bit-line voltage $V_{DL}$ rises considerably slower than each of selected voltages $V_{SG}$, $V_{SL}$, and $V_{CL}$. In the inventive example of FIG. 6, selected voltage $V_{SG}$ applied to select gate SG of an unselected FET 20 briefly becomes greater than unselected bit-line voltage $V_{DL}$ applied to drain D. However, selected select-gate voltage $V_{SG}$ never exceeds unselected bit-line voltage $V_{DL}$ by at least the 1-V fixed threshold voltage of the regular FET portion of that FET 20. Accordingly, inversion layer ID does not form in unselected FET 20 during the programming operation. Unselected FET 20 remains off during the programming operation and does not consume unnecessary power or undergo any programming disturbance that detrimentally affects the erased condition of that FET 20.

In the comparative example of FIG. 7, selected voltage $V_{SG}$ applied to select gate SG of an unselected FET 20 exceeds unselected bit-line voltage $V_{DL}$ applied to drain D by at least the 1-V fixed threshold voltage of the regular-FET portion of that FET 20 during the time period indicated by item 120 because selected select-gate voltage $V_{SG}$ starts rising at the same time as unselected voltage $V_{DL}$. Inversion layer ID forms in unselected FET 20 during that time period. Selected voltage $V_{CL}$ applied to control gate CG of unselected FET 20 exceeds unselected bit-line voltage $V_{DL}$ by at least the erased value of the programmable threshold voltage of that FET 20 during at least part of the time period represented by item 120 in the comparative example of FIG. 7. Accordingly, inversion layer IS also forms in unselected FET 120 during at least part of that time period. Since inversion layer ID is also formed, unselected FET 20 is turned on during at least part of the time period represented by item 120.

Selected voltage $V_{SL}$ applied to source S of unselected FET 20 in the comparative example of FIG. 7 exceeds unselected bit-line voltage $V_{DL}$ during the time period represented by item 120 so that electrons flow from drain D of that FET 20 to source S during at least part of that time period. With selected control-line voltage $V_{CL}$ being relatively high compared to unselected bit-line voltage $V_{DL}$ during the time period represented by item 120, some of the electrons are drawn into floating gate FG. This increases the programmable threshold voltage of unselected FET 20 and moves its programmable threshold voltage away from the initial erased value and toward the programmed value to create a programming disturbance.

The increase in the programmable threshold voltage in the comparative example of FIG. 7 can sometimes be sufficiently great to cause a reading error during a subsequent read operation performed on unselected FET 20. The drain-to-source electron flow during at least part of the time period represented by item 120 also unnecessarily consumes power. By arranging for selected select-gate voltage $V_{SG}$ to start rising after unselected bit-line voltage $V_{DL}$, selected source-line voltage $V_{SL}$, and selected control-line voltage $V_{CL}$ start rising in accordance with the inventive example of FIG. 6, the EPROM of FIGS. 1 and 2 substantially avoids programming disturbances and unnecessary power consumption that would occur in an EPROM having the timing characteristics of the comparative example of FIG. 7.

Figure 8:
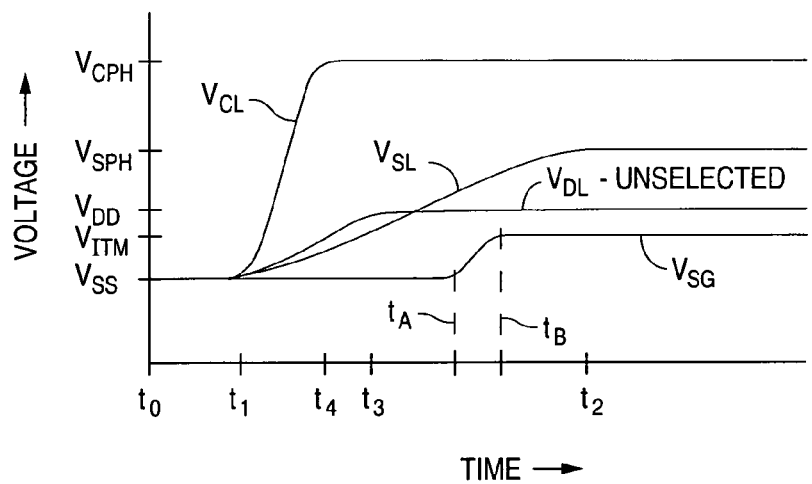
Figure 9:
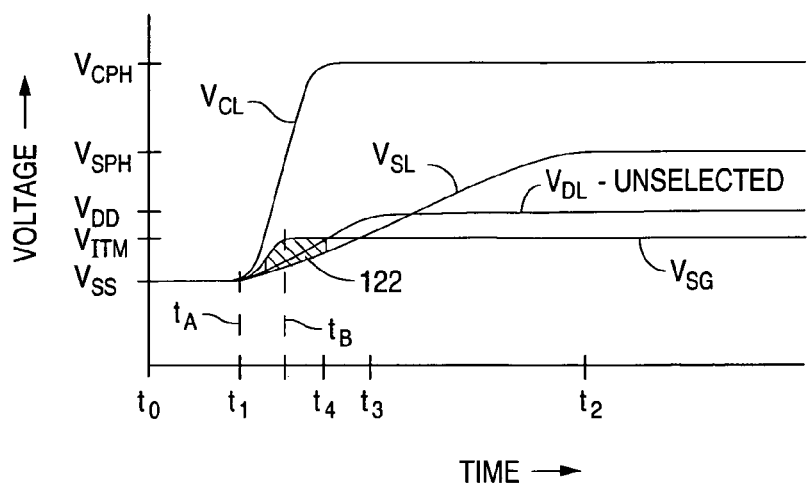

FIGS. 8 and 9 deal with the main portion of a programming operation in which selected source-line voltage $V_{SL}$ rises slower than unselected bit-line voltage $V_{DL}$, selected select-gate voltage $V_{SG}$, and selected control-line voltage $V_{CL}$. In the comparative example of FIG. 9, selected voltage $V_{SG}$ applied to select gate SG of an unselected FET 20 during the programming operation exceeds selected voltage $V_{SL}$ applied to source S of that FET 20 by at least the 1-V fixed threshold voltage of that FET's regular FET portion during the time period indicated by item 122. Inversion layer ID is formed during that time period. Selected voltage $V_{CL}$ applied to control gate CG of unselected FET 20 is sufficiently high compared to selected source-line voltage $V_{SL}$ during at least part of the time period represented by item 122 that inversion layer IS forms during at least part of that time period. Unselected FET 20 thus turns on during at least part of the time period represented by item 122.

Unselected bit-line voltage $V_{DL}$ applied to drain D of unselected FET 20 exceeds selected source-line voltage $V_{SL}$ in the comparative example of FIG. 9. Since unselected FET 20 is turned on during at least part of the time period represented by item 122, electrons flow from source S of that FET 20 to its drain D during at least part of that time period. Although no programming disturbance occurs in the comparative example of FIG. 9, the source-to-drain electron flow during the programming operation unnecessarily consumes power.

In the inventive example of FIG. 8, selected source-gate voltage $V_{SG}$ starts rising sufficiently after selected source-line voltage $V_{SL}$ starts rising that selected voltage $V_{SG}$ substantially never equals or exceeds selected voltage $V_{SL}$ during the main portion of the programming operation. Unselected FET 20 in the inventive example of FIG. 8 remains off during the main programming portion because inversion layer ID does not form. Unselected FET 20 thus does not unnecessarily consume power (or undergo programming disturbances) in the inventive example of FIG. 8.

Figure 10:
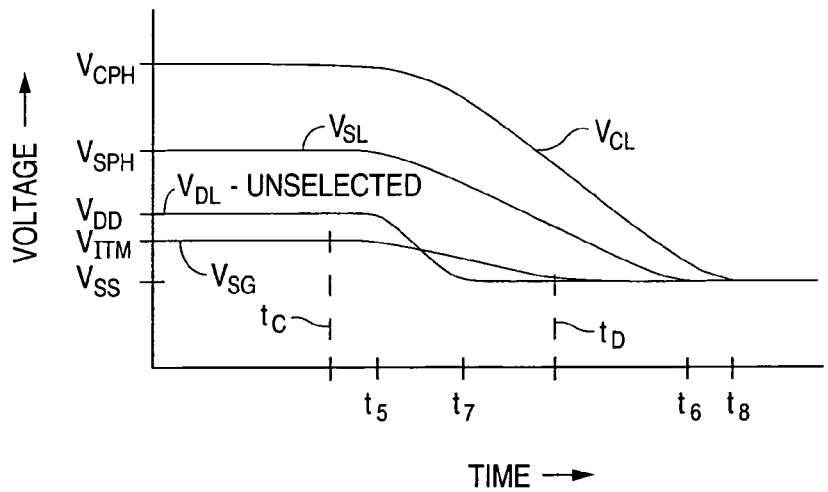
Figure 11:
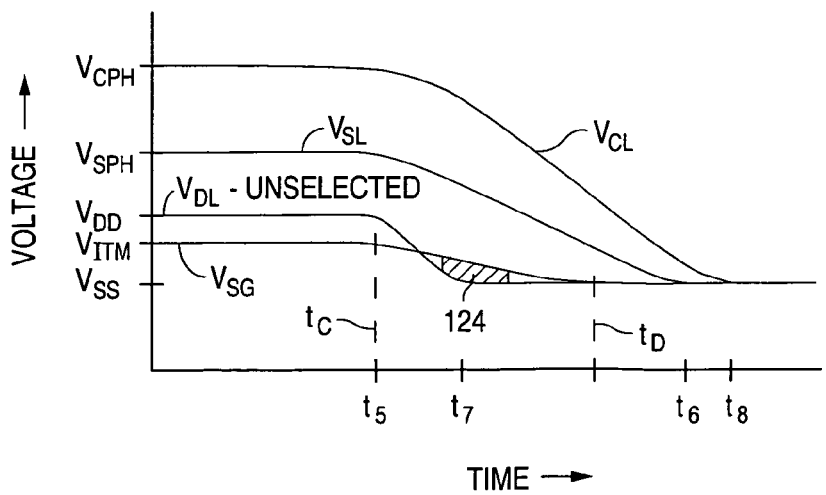

FIGS. 10 and 11 deal with the discharge portion of a programming operation in which unselected bit-line voltage $V_{DL}$ drops considerably faster than each of selected voltages $V_{SG}$, $V_{SL}$, and $V_{CL}$. Similar to what occurs in the comparative example of FIG. 7, these programming conditions cause unselected FET 20 to be turned on during at least part of the time period represented by item 124 in the comparative example of FIG. 11 because selected select-gate voltage $V_{SG}$ starts falling at the same time as unselected bit-line voltage $V_{DL}$ and selected voltages $V_{SL}$ and $V_{SG}$. Electrons flow from drain D of unselected FET 20 to its source S in the comparative example of FIG. 11. As a result, unselected FET 20 in the comparative example of FIG. 11 undergoes a programming disturbance and unnecessarily consumes power. By arranging for selected select-gate voltage $V_{SG}$ to start falling sufficiently before unselected bit-line voltage $V_{DL}$ and selected voltages $V_{SL}$ and $V_{CL}$ start falling as presented in the inventive example of FIG. 10., the EPROM of FIGS. 1 and 2 substantially avoids programming disturbances and unnecessary power consumption that arise in the comparative example of FIG. 11.

Figure 12:
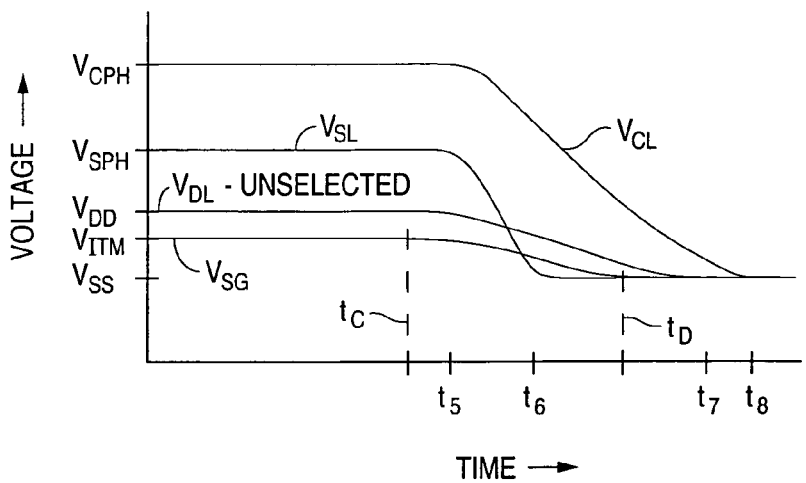
Figure 13:
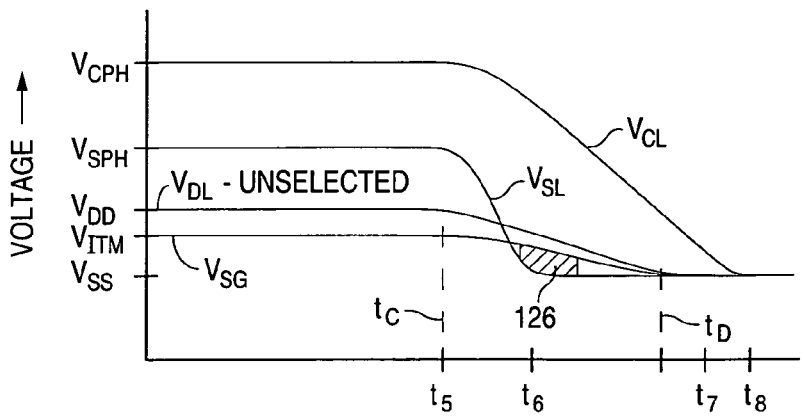

FIGS. 12 and 13 deal with the discharge portion of a programming operation in which selected source-line voltage $V_{SL}$ drops faster than unselected bit-line voltage $V_{DL}$, selected select-gate voltage $V_{SG}$, and selected control-gate voltage $V_{CL}$. Analogous to what occurs in the comparative example of FIG. 9, these discharge conditions cause unselected FET 20 to be turned on during at least part of the time period represented by item 126 in the comparative example of FIG. 13 because, as in the comparative example of FIG. 11, selected select-gate voltage $V_{SG}$ starts falling at the same time as selected voltage $V_{SL}$, unselected voltage $V_{DL}$, and selected voltage $V_{CL}$. Although no programming disturbance occurs in the comparative example of FIG. 13, electrons flow from source S of unselected FET 20 to its drain D. The resulting unnecessary power consumption is substantially avoided in the inventive example of FIG. 12 by having selected select-gate voltage $V_{SG}$ start falling sufficiently before selected voltage $V_{SL}$, unselected voltage $V_{DL}$, and selected voltage $V_{CL}$ start falling.

Figure 14:
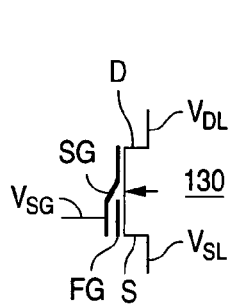
FIG. 14 is a circuit diagram of another split-gate floating-gate FET alternatively employable as a memory cell in an EPROM configured according to the invention.
Figure 15:
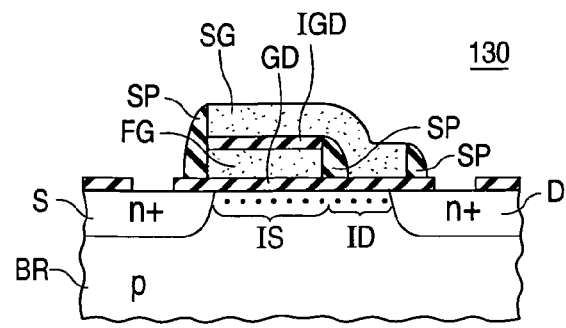
FIG. 15 is a cross-sectional side view of an embodiment of the floating-gate FET in FIG. 14.

The principles of the invention are not limited to memory cells formed with triple-gate split-gate floating-gate FETs. For example, the invention encompasses memory cells implemented with split-gate floating-gate FETs in which the select (or control) gate overlies the floating gate and extends laterally beyond the floating gate so as to partially overlie the drain. FIGS. 14 and 15 depict one such n-channel double-gate split-gate floating-gate FET 130 in which floating gate FG overlies part of the channel portion of body region BR and extends partially over source S while select gate SG overlies floating gate FG, extends partially over the remainder of the channel portion, and extends partially over drain D. As occurs with triple-gate FET 20, inversion layer IS forms along the upper semiconductor surface below floating gate FG in FET 130. Inversion layer ID forms below the portion of select gate SG situated to the side of floating gate FG in FET 130.

In programming FET 130 so as to place it in the programmed condition with a high programmable threshold voltage representing a logic "0", a high programming voltage is applied to source S. Due to capacitive coupling, the high source programming voltage causes the voltage on floating gate FG to rise sufficiently to attract electrons flowing from drain D to source S during the programming operation. Hence, FET 130 is programmed in basically the same way as FET 20 except that source-line voltage $V_{SL}$ and control-line voltage $V_{CL}$ applied to FET 20 are essentially compressed into source-line voltage $V_{SL}$ applied to FET 130. When FET 130 is an unselected one of a group of FETs 130 in a selected row of FETs 130, performing a programming operation on the selected group results in an avoidance of programming disturbances and unnecessary power consumption generally in the manner described above. Subject to reversing the voltage polarities, FET 130 can be implemented as a p-channel device.

Referring to FIG. 16, the EPROM containing the circuitry of FIGS. 1 and 2 is normally allocated into a plurality of L substantially identical mats $140_0$, $140_1$, ... $140_{L-1}$ where integer L is 8 in the example of FIG. 16. Each mat $140_i$, where i is a running integer varying from 0 to L-1, consists of an array of substantially identical simultaneously erasable EPROM sectors $142^{jk}$ as shown in FIG. 17. Integer j, the row number, varies from 0 to M-1 where M is the number of rows. Integer k, the column number, varies from 0 to N-1 where N is the number of columns. M and N are both 4 in the example of FIG. 17. The total number of sectors $142_{jk}$ is LMN, 128 in the example of FIGS. 16 and 17.

The present invention has been described with reference to particular embodiments solely for the purpose of illustration. For instance, the present programming technique can be used in devices other than EPROMs. The definitions of the programmed condition as the low logic state, e.g., logic "0", and the erased condition as the high logic state, e.g. logic "1", are arbitrary and can be reversed. Since source/drain regions S and D of each floating-gate memory FET 20 are specifically referred to respectively as source S and drain D only for convenience, source-line voltage $V_{SL}$ and bit-line voltage $V_{DL}$ at source S and drain D of each FET 20 can be respectively more generally referred to as first and second voltages respectively at first source/drain region S and second source/drain region D of that FET 20.

Source-line driver 96, control-line driver 102, and select-gate driver 108 can be respectively placed after core source-line decoder 98, core control-line decoder 104, and core select-gate decoder 112 in the signal paths for respectively generating source-line voltages $V_{SL}$, control-line voltages $V_{CL}$, and select-gate voltages $V_{SG}$ in the implementation of FIG. 2. Control-voltage comparator 56 can be deleted while retaining source-voltage comparator 54. Select-gate decoder 52 then causes selected select-gate voltage $V_{SG}$ to start going from $V_{SS}$ up to $V_{DD}$ immediately after source-voltage percentage-target-attainment voltage $V_{ST}$ has changed to a value indicating that programming source voltage $V_{SP}$ has reached source-voltage percentage-target reference voltage $V_{SRF}$. Various modifications and applications may thus be made by those skilled in the art without departing from the true scope of the invention as defined in the appended claims.

I claim:

1. A method of programming a floating-gate field-effect transistor ("FET") in which first and second source/drain regions are separated from each other by a channel portion of a body region that forms a pn junction with each source/drain region, a floating-gate electrode laterally adjacent to the first source/drain region overlies a first part of the channel portion, and a select-gate electrode laterally adjacent to the second source/drain region and spaced apart from the floating-gate electrode overlies a second part of the channel portion lateral to the first part of the channel portion, the FET initially being in an erased condition with a programmable threshold voltage (a) less than a first transition value $V_{T1}$ if the FET is of n-channel type and (b) greater than $-V_{T1}$ if the FET is of p-channel type, the FET being selectively placable in a programmed condition with the programmable threshold voltage (a) greater than a second transition value $V_{T2}$ if the FET is of n-channel type and (b) less than $-V_{T2}$ if the FET is of p-channel type where $V_{T2}$ exceeds or equals $V_{T1}$, the method comprising:

changing a first voltage applied to the first source/drain region from a nominal first value to a programming first value;

controlling a second voltage applied to the second source/drain region so as to (a) change from a nominal second value to a programming-inhibit second value if the FET is to remain in its erased condition and (b) stay largely at the nominal second value if the FET is to be placed in its programmed condition; and changing a select voltage applied to the select-gate electrode from a nominal select value to a programming-enable select value such that the FET (a) remains in the erased condition if the second voltage goes to its programming-inhibit value or (b) enters the programmed condition if the second voltage stays largely at its nominal value and such that, in an instance where the FET is to remain in its erased condition, the select voltage starts to change from its nominal value to the programming-enable value after the second voltage starts to change from its nominal value to the programming-inhibit value.

2. A method as in claim 1 wherein the select voltage starts to change from its nominal value to the programming-enable value after the first voltage starts to change from its nominal value to its programming value.

3. A method as in claim 1 further including subsequent to the changing and controlling acts:

changing the select voltage from its programming-enable value back largely to its nominal value;

changing the first voltage from its programming value back largely to its nominal value; and controlling the second voltage so as to (a) change from its programming-inhibit value back largely to its nominal value if the second voltage earlier changed from its nominal value to its programming-inhibit value and (b) otherwise stay largely at its nominal value such that, in an instance where the second voltage changes from its programming-inhibit value back largely to its nominal value, the select voltage starts to change from its programming-enable value back largely to its nominal value before the second voltage starts to change from its programming-inhibit value back largely to its nominal value.

4. A method as in claim 3 wherein the select voltage starts to change from its programming-enable value back largely to its nominal value before the first voltage starts to change from its programming value back largely to its nominal value.

5. A method as in claim 1 wherein:
the FET is a memory element that operates between a low supply voltage and a high supply voltage during reading of the memory element;
the programming value is (a) greater than the high supply voltage if the FET is of n-channel type and (b) less than the low supply voltage if the FET is of p-channel type;
the programming-inhibit and programming-enable values are both (a) greater than the low supply voltage if the FET is of n-channel type and (b) less than the high supply voltage if the FET is of p-channel type; and
the programming-inhibit value is (a) greater than the programming-enable value if the FET is of n-channel type and (b) less than the programming-enable value if the FET is of p-channel type.

6. A method as in claim 5 wherein the nominal values are all largely equal to one another.

7. A method as in claim 1 wherein a control-gate electrode overlies the floating-gate electrode above the first part of the channel portion and is spaced apart from the select-gate electrode, the method further including changing a control voltage applied to the control-gate electrode from a nominal control value to a programming control value.

8. A method as in claim 7 wherein the select voltage starts to change from its nominal value to its programming-enable value after the first and control voltages start to change from their nominal values to their programming values.

9. A method as in claim 7 wherein the select voltage starts to change from its nominal value to its programming-enable value after at least one of the first and control voltages has changed at least 50% from its nominal value to its programming value.

10. A method as in claim 7 wherein, in an instance where the FET is to remain in the erased condition, the select voltage starts to change from its nominal value to its programming-enable value after the second voltage largely reaches the programming-inhibit value.

11. A method as in claim 7 further including subsequent to the changing and controlling acts:
changing the select voltage from its programming-enable value back largely to its nominal value;
changing the first and control voltages from their programming values back largely to their nominal values; and
controlling the second voltage so as to (a) change from its programming-inhibit value back largely to its nominal value if the second voltage earlier changed from its nominal value to its programming-inhibit value and (b) otherwise stay largely at its nominal value such that, in an instance where the second voltage changes from its programming-inhibit value back largely to its nominal value, the select voltage starts to change from its programming-enable value back largely to its nominal value before the second voltage starts to change from its programming-inhibit value back largely to its nominal value.

12. A method as in claim 11 wherein the select voltage starts to change from its programming-enable value back largely to its nominal value before the first and control voltages start to change from their programming values back largely to their nominal values.

13. A method as in claim 11 where, in an instance where the second voltage changes from its programming-inhibit value back largely to its nominal value, the select voltage substantially completes changing from its programming-enable value back largely to its nominal value before the second voltage starts to change from its programming-inhibit value back largely to its nominal value.

14. A method as in claim 7 wherein:
the FET is a memory element that operates between a low supply voltage and a high supply voltage during reading of the memory element;
each programming value is (a) greater than the high supply voltage if the FET is of n-channel type and (b) less than the low supply voltage if the FET is of p-channel type;
the programming-inhibit and programming-enable values are both (a) greater than the low supply voltage if the FET is of n-channel type and (b) less than the high supply voltage if the FET is of p-channel type; and
the programming-inhibit value is (a) greater than the programming-enable value if the FET is of n-channel type and (b) less than the programming-enable value if the FET is of p-channel type.

15. A method as in claim 14 wherein the nominal values are all largely equal to (a) the low supply voltage if the FET is of n-channel type and (b) the high supply voltage if the FET is of p-channel type.

16. A method as in claim 7 wherein, for a specified voltage difference between the first and control voltages, an inversion layer (a) occurs in the first part of the channel portion when the FET is in the erased condition and (b) does not occur there when the FET is in the programmed condition.

17. A method as in claim 1 wherein the select-gate electrode extends over the floating-gate electrode above the first part of the channel portion.

18. A method as in claim 1 wherein $V_{T2}$ exceeds $V_{T1}$.

19. A method as in claim 1 wherein the FET is of n-channel type.

20. A method as in claim 19 wherein:
the changing acts comprise raising the first and control voltages from their nominal values respectively to their programming and programming-enable values; and
the controlling act comprises raising the second voltage from its nominal value to the programming-inhibit value if the FET is to remain in the erased condition.

21. A method of programming a group of memory elements respectively comprising like-polarity floating-gate field-effect transistors ("FETs") of an erasable programmable read-only memory in which each FET has (a) first and second source/drain regions laterally separated from each other by a channel portion of a body region that forms a pn junction with each source/drain region, (b) a floating-gate electrode laterally adjacent to the first source/drain region and overlying a first part of the channel portion, and (c) a select-gate electrode laterally adjacent to the second source/drain region, spaced apart from the floating-gate electrode, and overlying a second part of the channel portion lateral to the first portion of the channel portion, each FET being in an erased condition with a programmable threshold voltage is (a) less than a first transition value $V_{T1}$ if that FET is of n-channel type and (b) greater than $-V_{T1}$ if that FET is of p-channel type, each FET being in a programmed condition when its programmable threshold voltage is (a) greater than a second transition value $V_{T2}$ if that FET is of n-channel type and (b) less than $-V_{T2}$ if that FET is of p-channel type where $V_{T2}$ exceeds or equals $V_{T1}$, the method comprising:

selecting a group of the FETs that are initially in their erased conditions and are to be selectively placed in their programmed conditions;

changing first voltages applied respectively to the first source/drain regions of the selected FETs from respective nominal first values to respective programming first values;

controlling second voltages applied respectively to the second source/drain regions of the selected FETs so that the second voltage for each selected FET (a) changes from a nominal second value to a programming-inhibit value if that FET is to remain in its erased condition and (b) stays largely at the nominal second value if that FET is to be placed in the programmed condition; and changing select voltages respectively applied to the select-gate electrodes of the selected FETs from respective nominal select values to respective programming-enable select values such that each selected FET (a) remains in its erased condition if its second voltage goes to the programming-inhibit value for that scrod voltage and (b) enters its programming condition if its second voltage stays largely at the nominal value for that second voltage and such that, in each instance where one of the selected FETs is to remain in its erased condition, the select voltage for that selected FET starts to change from the nominal value for that select voltage to its programming-enable value after the second voltage for that selected FET starts to change from the nominal value for that second voltage to its programming-inhibit value.

22. A method as in claim 21 wherein the select voltages all start to change from their nominal values to their programming-enable values after the first voltages all start to change from their nominal values to their programming values.

23. A method as in claim 22 wherein a control-gate electrode of each FET overlies its floating-gate electrode above the first part of its channel portion and is spaced apart from its select-gate electrode, the method further including changing control voltages applied respectively to the control-gate electrodes from respective nominal control values to respective programming control values.

24. A method as in claim 23 wherein the select voltages all start to change from their nominal values to their programming-enable values after the first and control voltages all start to change from their nominal values to their programming values.

25. An electronic circuit comprising:

a floating-gate field-effect transistor ("FET") which comprises (a) first and second source/drain regions laterally separated from each other by a channel portion of a body region that forms a pn junction with each source/drain region, (b) a floating-gate electrode laterally adjacent to the first source/drain region and overlying a first part of the channel portion, and (c) a select-gate electrode laterally adjacent to the second source/drain region, spaced apart from the floating-gate electrode, and overlying a second part of the channel portion lateral to the first part of the channel portion, the FET being in an erased condition with a programmable threshold voltage (a) less than a first transition value $V_{T1}$ if the FET is of n-channel type and (b) greater than $-V_{T1}$ if the FET is of p-channel type, the FET being in a programmed condition when its programmable threshold voltage is (a) greater than a second transition value $V_{T2}$ if the FET is of n-channel type and (b) less than $-V_{T2}$ if the FET is of p-channel type where $V_{T2}$ exceeds or equals $V_{T1}$;

first control circuitry which applies a first voltage to the first source/drain region and is operable to change the first voltage from a nominal first value to a programming first value during a programming operation;

second control circuitry which applies a second voltage to the second source/drain region and is operable (a) to change the second voltage from a nominal second value to a programming-inhibit second value during a programming operation if the FET is initially in the erased condition and is to remain in the erased condition and (b) to maintain the second voltage largely at the nominal second value during the programming operation if the FET is to be placed in its programmed condition; and select-gate control circuitry which applies a select voltage to the select-gate electrode and is operable to change the select voltage from a nominal select value to a programming-enable select value during a programming operation such that, when the FET was in the erased condition prior to a programming operation, the FET (a) remains in the erased condition during that programming operation if the second voltage goes to its programming-inhibit value during that programming operation and (b) enters the programmed condition during that programming operation if the second voltage stays largely at its nominal value during that programming operation and such that, in an instance where the FET is to remain in the erased condition during a programming operation, the select voltage starts to change from its nominal value to its programming-enable value after the second voltage starts to change from its nominal value to its programming-inhibit value.

26. A circuit as in claim 25 wherein, during a programming operation, the select voltage starts to change from its nominal value to the programming-enable value after the first voltage starts to change from its nominal value to its programming value.

27. A circuit as in claim 25 wherein the FET includes a control-gate electrode overlying the floating-gate electrode above the first part of the channel portion and spaced apart from the select-gate electrode, the circuit further including control-gate control circuitry which applies a control voltage to the control-gate electrode and is operable to change the control voltage from a nominal control value to a programming control value during a programming operation.

28. A circuit as in claim 27 wherein, during a programming operation, the select voltage starts to change from its nominal value to the programming-enable value after the first voltage starts to change from its nominal value to its programming value.

29. A circuit as in claim 27 wherein, for a specified voltage difference between the first and control voltages, an inversion layer (a) occurs in the first part of the channel portion when the FET is in the erased condition and (b) does not occur there when the FET is in the programmed condition.

30. A circuit as in claim 25 wherein the select-gate electrode extends over the floating-gate electrode above the first part of the channel portion.

31. An erasable programmable read-only memory ("EPROM") comprising:
  a group of memory elements respectively comprising like-polarity floating-gate field-effect transistors ("FETs") wherein each FET comprises (a) first and second source/drain regions laterally separated from each other by a channel portion of a body region that forms a pn junction with each source/drain region, (b) a floating-gate electrode laterally adjacent to the first source/drain region and overlying a first part of the channel portion, and (c) a select-gate electrode laterally adjacent to the second source/drain region, spaced apart from the floating-gate electrode, and overlying a second part of the channel portion lateral to the first part of the channel portion, each FET being in an erased condition with a programmable threshold voltage (a) less than a first transition value $V_{T1}$ if that FET is of n-channel type and (b) greater than $-V_{T1}$ if that FET is of p-channel type, each FET being in a programmed condition when its programmable threshold voltage is (a) greater than a second transition value $V_{T2}$ if that FET is of n-channel type and (b) less than $-V_{T2}$ if that FET is of p-channel type where $V_{T2}$ exceeds or equals $V_{T1}$;
  first control circuitry which applies first voltages respectively to the first source/drain regions and is operable to change the first voltage for each FET from a nominal first value to a programming first value during a programming operation for that FET;
  second control circuitry which applies second voltages respectively to the second source/drain regions and is operable (a) to change the second voltage for each FET from a nominal second value to a programming second value during a programming operation for that FET if it is initially in its erased condition and is to remain in its erased condition during that programming operation and (b) to maintain the second voltage for each FET largely at the nominal value for that second voltage during the programming operation if that FET is to be placed in its programmed condition during that programming operation; and
  select-gate control circuitry which applies select voltages respectively to the select-gate electrodes and is operable to change the select voltage for each FET from a nominal select value to a programming select value during a programming operation for that FET such that, during a programming operation for a selected group of the FETs where each selected FET was in its erased condition prior to that programming operation, each selected FET (a) remains in its erased condition during that programming operation if its second voltage goes to the programming-inhibit value for that second voltage during that programming operation and (b) enters its programmed condition during that programming operation if its second voltage stays largely at the nominal value for that second voltage during that programming operation and such that, in an instance where one of the selected FETs is initially in its erased condition and is to remain in its erased condition, the select voltage for that selected FET starts changing from the nominal value for that select voltage to its programming-enable value after the second voltage for that selected FET starts changing from the nominal value for that second voltage to its programming-inhibit value.

32. An EPROM as in claim 31 wherein, during a programming operation, the select voltages all start to change from their nominal values to their programming-enable values after the first voltages all start to change from their nominal values to their programming values.

33. An EPROM as in claim 31 wherein a control-gate electrode of each FET overlies its floating-gate electrode above the first part of its channel portion and is spaced apart from its select-gate electrode, the EPROM further including control-gate circuitry which applies control voltages respectively to the control-gate electrodes and is operable to change the control voltage for each FET from a nominal control value to a programming control voltage during a programming operation for that FET.

34. An EPROM as in claim 33 wherein, during a programming operation, the select voltages all start to change from their nominal values to their programming-enable values after the first and control voltages all start to change from their nominal values to their programming values.

35. A method as in claim 21 further including subsequent to the changing and controlling acts:
  changing the select voltages from their programming-enable values back largely to their nominal values;
  changing the first voltages from their programming values back largely to their nominal values; and
  controlling the second voltages so that each second voltage (a) changes from its programming-inhibit value back largely to its nominal value if that second voltage earlier changed from its nominal value to its programming-inhibit value and (b) otherwise stays largely at its nominal value such that, in an instance where the second voltage for one of the selected FETs changes from the programming-inhibit value for that second voltage back largely to its nominal value, the select voltage for that selected FET starts to change from the programming-enable value for that select voltage back largely to its nominal value before the second voltage for that selected FET starts to change from the programming-inhibit value for that second voltage back largely to its nominal value.

36. A method as in claim 35 wherein the select voltages starts to change from their programming-enable values back largely to their nominal values before the first voltages start to change from their programming values back largely to their nominal values.

37. A method as in claim 23 further including subsequent to the changing and controlling acts:
  changing the select voltages from their programming-enable values back largely to their nominal values;
  changing the first and control voltages from their programming values back largely to their nominal values; and
  controlling the second voltages so that each second voltage (a) changes from its programming-inhibit value back largely to its nominal value if that second voltage earlier changed from its nominal value to its programming-inhibit value and (b) otherwise stays largely at its nominal value such that, in an instance where the second voltage for one of the selected FETs changes from the programming-inhibit value for that second voltage back largely to its nominal value, the select voltage for that selected FET starts to change from the programming-enable value for that select voltage back largely to its nominal value before the second voltage for that selected FET starts to change from the programming-inhibit value for that second voltage back largely to its nominal value.

38. A method as in claim 35 wherein the select voltages starts to change from their programming-enable values back largely to their nominal values before the first and control voltages start to change from their programming values back largely to their nominal values.

39. A circuit as in claim 25 wherein:
the select-gate control circuitry is operable to change the select voltage from its programming-enable value back largely to its nominal value;
the first control circuitry is operable to change the first voltage from its programming value back largely to its nominal value; and
the second control circuitry is operable to control the second voltage so that it (a) changes from its programming-inhibit value back largely to its nominal value if the second voltage earlier change from its nominal value to its programming-inhibit value and (b) otherwise stays largely at its nominal value such that, in an instance where the second voltage changes from its programming-inhibit value back largely to its nominal value, the select voltage starts to change from its programming-enable value back largely to its nominal value before the second voltage starts to change from its programming-inhibit value back largely to its nominal value.

40. A circuit as in claim 39 wherein the select voltage starts to change from its programming-enable value back largely to its nominal value before the first voltage starts to change from its programming value back largely to its nominal value.

41. A circuit as in claim 27 wherein:
the select-gate control circuitry is operable to change the select voltage from its programming-enable value back largely to its nominal value;
the control-gate control circuitry is operable to change the control voltage from its programming value back largely to its nominal value;
the first control circuitry is operable to change the first voltage from its programming value back largely to its nominal value; and
the second control circuitry is operable to control the second voltage so that it (a) changes from its programming-inhibit value back largely to its nominal value if the second voltage earlier changed from its nominal value to its programming-inhibit value and (b) otherwise stays largely at its nominal value such that, in an instance where the second voltage changes from its programming-inhibit value back largely to its nominal value, the select voltage starts to change from its programming-enable value back largely to its nominal value before the second voltage starts to change from its programming-inhibit value back largely to its nominal value.

42. A circuit as in claim 39 wherein the select voltage starts to change from its programming-enable value back largely to its nominal value before the first and control voltages start to change from their programming values back largely to their nominal values.

43. An EPROM as in claim 31 wherein:
the select-gate control circuitry is operable to change the select voltages from their programming-enable values back largely to their nominal values;
the first control circuitry is operable to change the first voltages from their programming values back largely to their nominal values; and
the second control circuitry is operable to control the second voltages so that each second voltage (a) changes from its programming-inhibit value back largely to its nominal value if that second voltage earlier changed from its nominal value to its programming- inhibit value and (b) otherwise stays largely at its nominal value such that, in an instance where the second voltage for one of the selected FETs changes from the programming-inhibit value for that second voltage back largely to its nominal value, the select voltage for that selected FET starts to change from the programming-enable value for that select voltage back largely to its nominal value before the second voltage for that selected FET starts to change from the programming-inhibit value for that second voltage back largely to its nominal value.

44. An EPROM as in claim 43 wherein the select voltages start to change from their programming-enable values back largely to their nominal values before the first voltages start to change from their programming values back largely to their nominal values.

45. An EPROM as in claim 33 wherein:
the select-gate control circuitry is operable to change the select voltages from their programming-enable values back largely to their nominal values;
the control-gate control circuitry is operable to change the control voltages from their programming values back largely to their nominal values;
the first control circuitry is operable to change the first voltages from their programming values back largely to their nominal values; and
the second control circuitry is operable to control the second voltages so that each second voltage (a) changes from its programming-inhibit value back largely to its nominal value if that second voltage earlier changed from its nominal value to its programming- inhibit value and (b) otherwise stays largely at its nominal value such that, in an instance where the second voltage for one of the selected FETs changes from the programming-inhibit value for that second voltage back largely to its nominal value, the select voltage for that selected FET starts to change from the programming-enable value for that select voltage back largely to its nominal value before the second voltage for that selected FET starts to change from the programming-inhibit value for that second voltage back largely to its nominal value.

46. An EPROM as in claim 45 wherein the select voltages start to change from their programming-enable values back largely to their nominal values before the first and control voltages start to change from their programming values back largely to their nominal values.

47. A method comprising:
providing a floating-gate field-effect transistor ("FET") which comprises (a) first and second source/drain regions laterally separated from each other by a channel portion of a body region that forms a pn junction with each source/drain region, (b) a floating-gate electrode laterally adjacent to the first source/drain region and overlying a first part of the channel portion, and (c) a select-gate electrode laterally adjacent to the second source/drain region, spaced apart from the floating-gate electrode, and overlying a second part of the channel portion lateral to the first part of the channel portion, the FET being in an erased condition with a programmable threshold voltage (a) less than a first transition value $V_{TT}$ if the FET is of n-channel type and (b) greater than -$V_{TT}$ if the FET is of p-channel type, the FET being in a programmed condition when its programmable threshold voltage is (a) greater than a second transition value $V_{T2}$ if the FET is of n-channel type and (b) less than -$V_{T2}$ if the FET is of p-channel type where $V_{T2}$ exceeds or equals $V_{TT}$;

providing first control circuitry for changing a first voltage applied to the first source/drain region from a nominal first value to a programming first value during a programming operation;

providing second control circuitry (a) for changing a second voltage applied to the second source/drain region from a nominal second value to a programming-inhibit second value during a programming operation if the FET is initially in the erased condition and is to remain in the erased condition and (b) for maintaining the second voltage largely at the nominal second value during the programming operation if the FET is to be placed in its programmed condition; and providing select-gate control circuitry for changing a select voltage applied to the select-gate electrode from a nominal select value to a programming-enable select value during a programming operation such that, when the FET was in the erased condition prior to a programming operation, the FET (a) remains in the erased condition during that programming operation if the second voltage goes to its programming-inhibit value during that programming operation and (b) enters the programmed condition during that programming operation if the second voltage stays largely at its nominal value during that programming operation and such that, in an instance where the FET is to remain in the erased condition during a programming operation, the select voltage starts to change from its nominal value to its programming-enable value after the second voltage starts to change from its nominal value to its programming-inhibit value.

48. A method as in claim 47 wherein, during a programming operation, the select voltage starts to change from its nominal value to the programming-enable value after the first voltage starts to change from its nominal value to its programming value.

49. A method comprising:

providing a group of like-polarity floating-gate field-effect transistors ("FETs") wherein each FET comprises (a) first and second source/drain regions laterally separated from each other by a channel portion of a body region that forms a pn junction with each source/drain region, (b) a floating-gate electrode laterally adjacent to the first source/drain region and overlying a first part of the channel portion, and (c) a select-gate electrode laterally adjacent to the second source/drain region, spaced apart from the floating-gate electrode, and overlying a second part of the channel portion lateral to the first part of the channel portion, each FET being in an erased condition with a programmable threshold voltage (a) less than a first transition value $V_{TI}$ if that FET is of n-channel type and (b) greater than -$V_{TI}$ if that FET is of p-channel type, each FET being in a programmed condition when its programmable threshold voltage is (a) greater than a second transition value $V_{T2}$ if that FET is of n-channel type and (b) less than -$V_{T2}$ if that FET is of p-channel type where $V_{T2}$ exceeds or equals $V_{TT}$;

providing first control circuitry (a) for applying first voltages respectively to the first source/drain regions and (b) for changing the first voltage for each FET from a nominal first value to a programming first value during a programming operation for that FET;

providing second control circuitry (a) for applying second voltages respectively to the second source/drain regions, (b) for changing the second voltage for each FET from a nominal second value to a programming second value during a programming operation for that FET if it is initially in its erased condition and is to remain in its erased condition during that programming operation, and (c) for maintaining the second voltage for each FET largely at the nominal value for that second voltage during the programming operation if that FET is to be placed in its programmed condition during that programming operation; and providing select-gate control circuitry (a) for applying select voltages respectively to the select-gate electrodes, (b) for changing the select voltage for each FET from a nominal select value to a programming select value during a programming operation for that FET such that, during a programming operation for a selected group of the FETs where each selected FET was in its erased condition prior to that programming operation, each selected FET (i) remains in its erased condition during that programming operation if its second voltage goes to the programming-inhibit value for that second voltage during that programming operation and (ii) enters its programmed condition during that programming operation if its second voltage stays largely at the nominal value for that second voltage during that programming operation and such that, in an instance where one of the selected FETs is initially in its erased condition and is to remain in its erased condition, the select voltage for that selected FET starts changing from the nominal value for that select voltage to its programming-enable value after the second voltage for that selected FET starts changing from the nominal value for that second voltage to its programming-inhibit value.

50. A method as in claim 49 wherein, during a programming operation, the select voltages all start to change from their nominal values to their programming-enable values after the first voltages all start to change from their nominal values to their programming values.

* * * * *